(12) United States Patent  
Sugaya et al.

(10) Patent No.: US 7,667,977 B2  
(45) Date of Patent: Feb. 23, 2010

(54) MOUNTING BOARD, MOUNTED BODY, AND ELECTRONIC EQUIPMENT USING THE SAME

(75) Inventors: Yasuhiro Sugaya, Osaka (JP); Toshiyuki Asahi, Osaka (JP); Katsumasa Miki, Osaka (JP); Yoshiyuki Yamamoto, Kyoto (JP); Hiroyuki Ishitomi, Osaka (JP); Tsuyoshi Himori, Osaka (JP)

(73) Assignee: Panasonic Corporation, Osaka (JP)

( * ) Notice: Subject to any disclaimer, the term of this patent is extended or adjusted under 35 U.S.C. 154(b) by 664 days.

(21) Appl. No.: 11/630,025

(22) PCT Filed: Jul. 13, 2006

(86) PCT No.: PCT/JP2006/013936  
§ 371 (c)(1),  
(2), (4) Date: Dec. 19, 2006

(87) PCT Pub. No.: WO2007/007830  
PCT Pub. Date: Jan. 18, 2007

(65) Prior Publication Data  
US 2008/0290497 A1    Nov. 27, 2008

(30) Foreign Application Priority Data  
Jul. 13, 2005    (JP) .......................... 2005-204156  
Aug. 30, 2005    (JP) .......................... 2005-248962

(51) Int. Cl.  
*H05K 1/16*    (2006.01)

(52) U.S. Cl. .................. 361/766; 361/763; 361/523  
(58) Field of Classification Search .......... 361/760–766, 361/510–523; 257/700–723  
See application file for complete search history.

(56) References Cited  
U.S. PATENT DOCUMENTS  
6,310,765 B1 *    10/2001    Tanahashi et al. ............ 361/516  
(Continued)

FOREIGN PATENT DOCUMENTS  
JP    2003-197849    7/2003  
(Continued)

*Primary Examiner*—Tuan T Dinh  
(74) *Attorney, Agent, or Firm*—Wenderoth, Lind & Ponack, L.L.P.

(57) ABSTRACT

The mounting board has a capacitor-forming sheet made from a valve metal, first and second board-forming structures, first and second electrodes, an extractor electrode, and a conductive polymer. The capacitor-forming sheet has an inner layer and a rough oxide film on at least one face of the inner layer. The first board-forming structure is provided on a face of the capacitor-forming sheet, and the second board-forming structure is provided on another face thereof on a side opposite to the first one. The first and second electrodes are isolated to each other and provided on a surface of at least one of the first and second board-forming structures. The extractor electrode and conductive polymer are provided inside at least one of the first and second board-forming structures. The extractor electrode electrically-connects the first electrode with the inner layer. The conductive polymer electrically-connects the second electrode with the rough oxide film.

19 Claims, 18 Drawing Sheets

U.S. PATENT DOCUMENTS

| | | | |
|---|---|---|---|
| 6,504,705 B2 * | 1/2003 | Shimada et al. | 361/528 |
| 6,693,793 B2 * | 2/2004 | Kuwako et al. | 361/323 |
| 6,975,516 B2 | 12/2005 | Asahi et al. | |
| 7,126,811 B2 * | 10/2006 | Hirano et al. | 361/523 |
| 7,319,599 B2 * | 1/2008 | Hirano et al. | 361/763 |
| 7,532,453 B2 * | 5/2009 | Yamamoto et al. | 361/306.2 |
| 2004/0246690 A1 | 12/2004 | Nakamura et al. | |
| 2005/0073818 A1 | 4/2005 | Hirano et al. | |

FOREIGN PATENT DOCUMENTS

| | | |
|---|---|---|
| JP | 2004-031641 | 1/2004 |
| JP | 2004-221176 | 8/2004 |
| JP | 2005-129910 | 5/2005 |

* cited by examiner

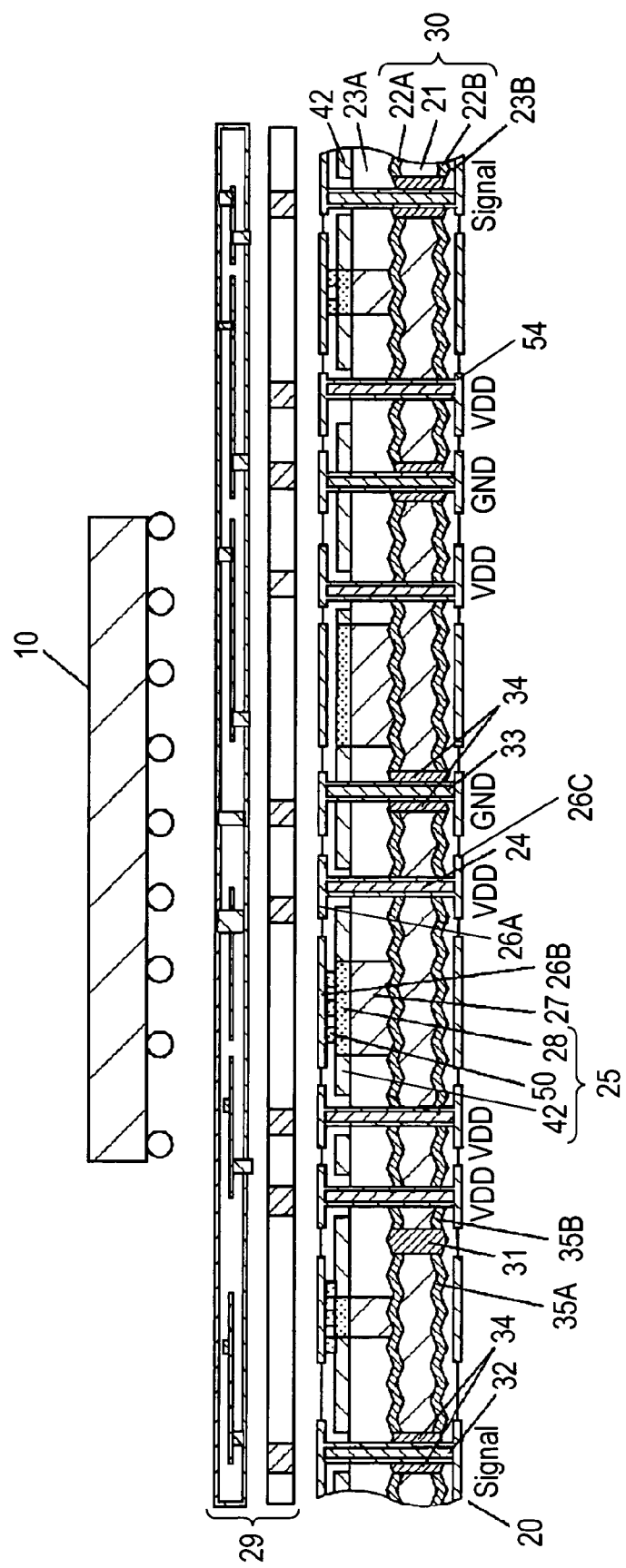

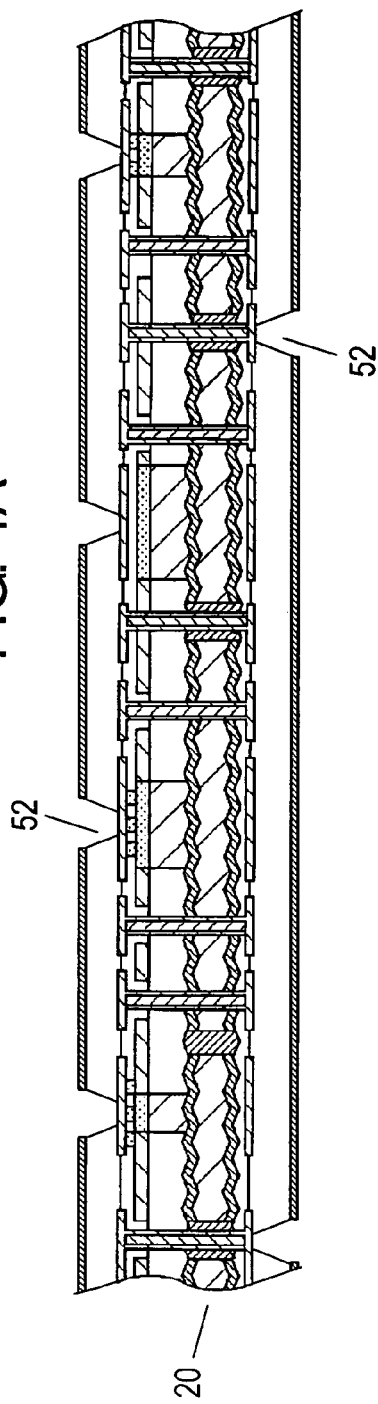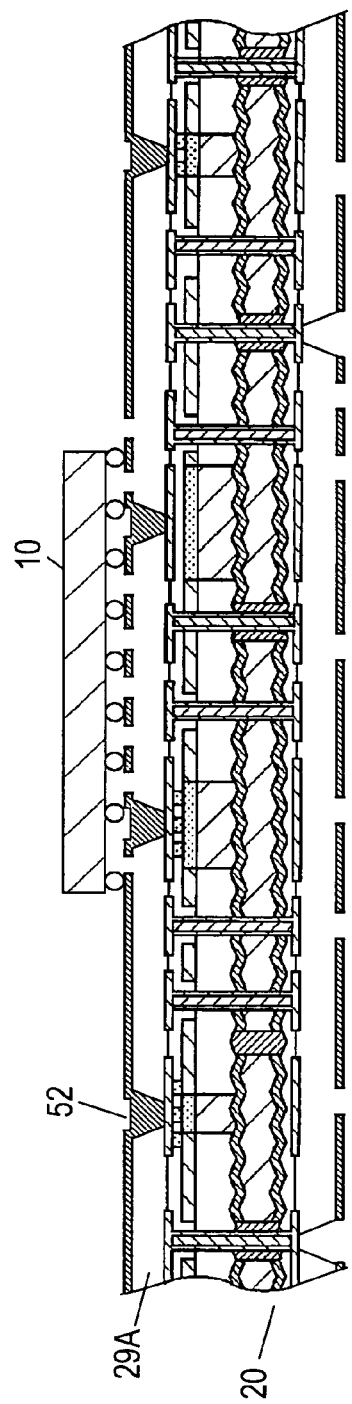

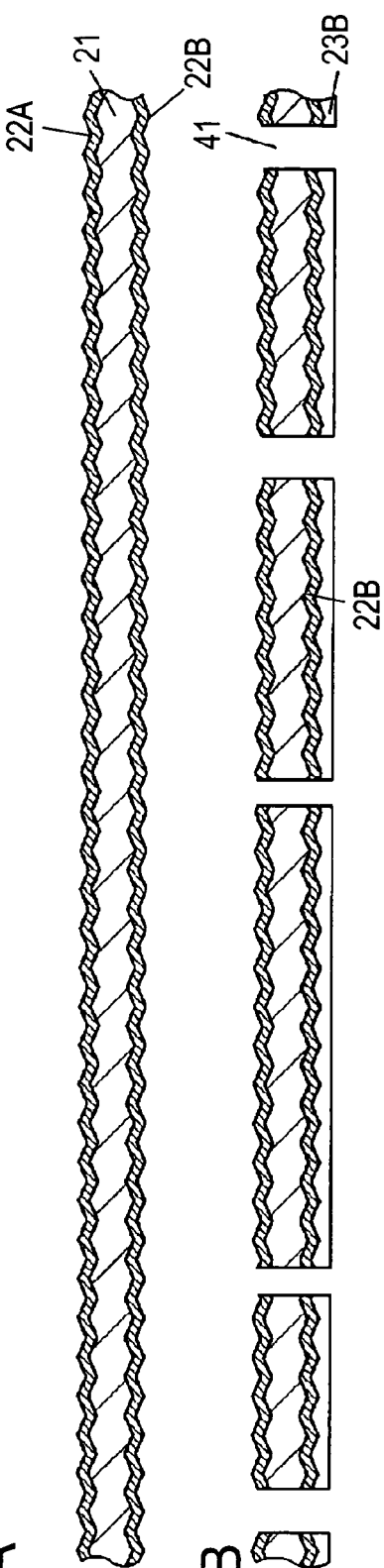
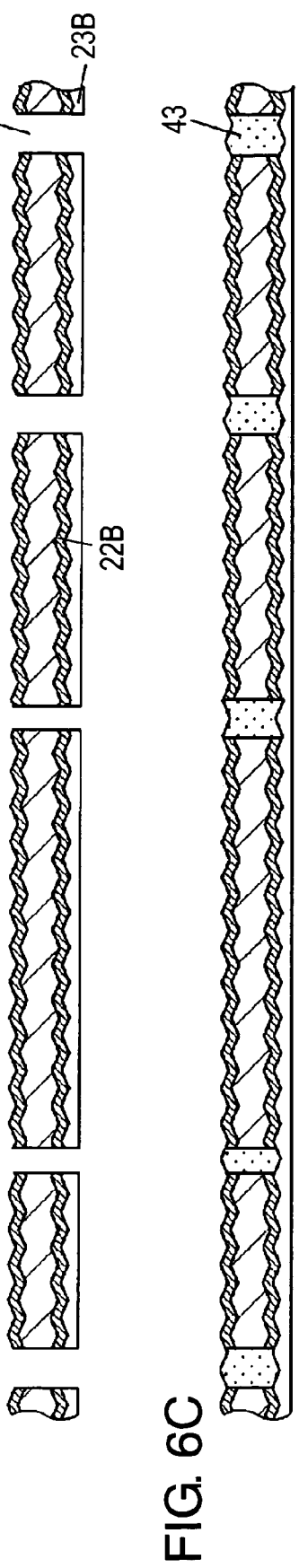
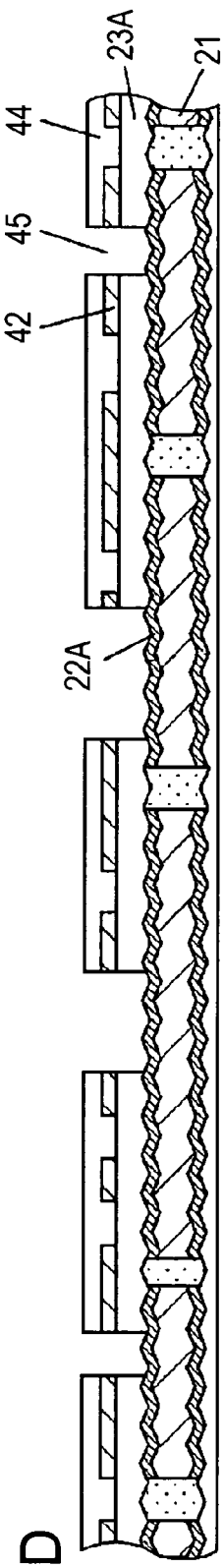
FIG. 6A
FIG. 6B
FIG. 6C
FIG. 6D

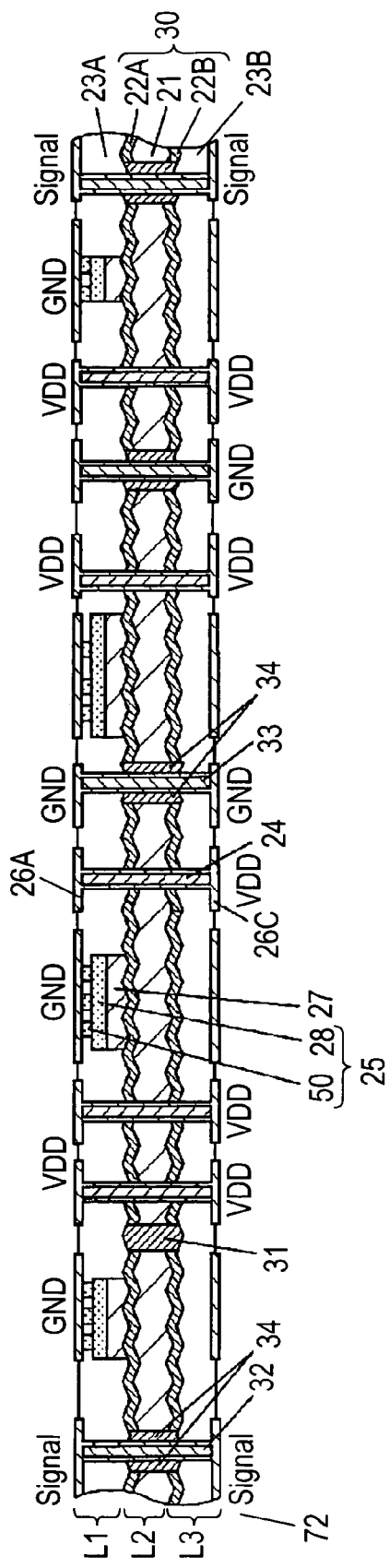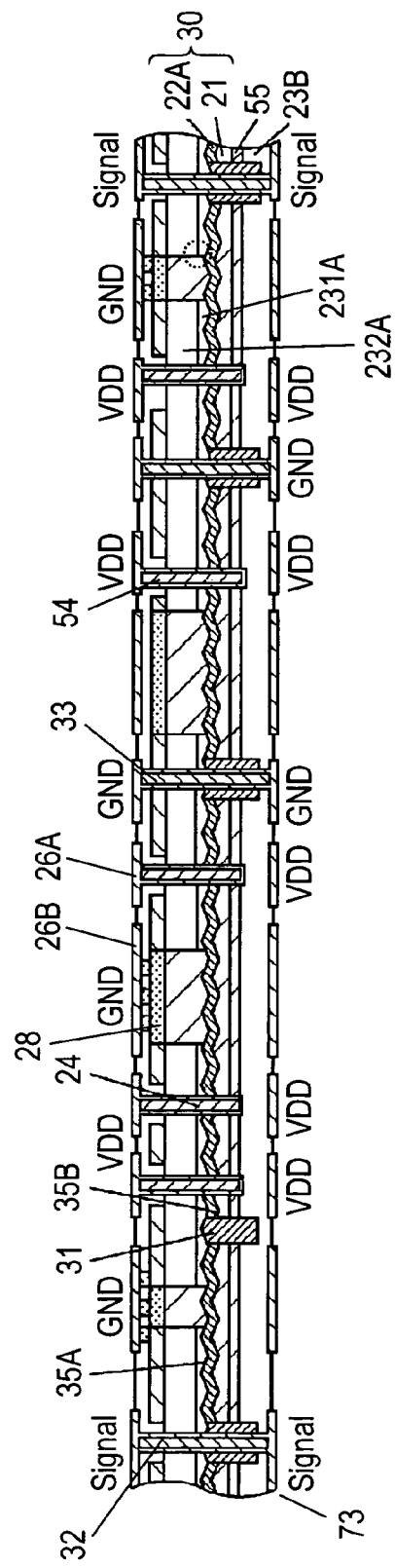

MOUNTING BOARD, MOUNTED BODY, AND ELECTRONIC EQUIPMENT USING THE SAME

This application is a U.S. national phase application of PCT International Application PCT/JP2006/313936, filed Jul. 13, 2006.

TECHNICAL FIELD

The present invention relates to a mounting board used for various kinds of electronic equipment, and particularly amounting board for a semiconductor device.

BACKGROUND ART

In recent years, an LSI capable of processing image signals at a high speed has been requested as television sets and video cassette recorders have been digitalized and enhanced in resolution and definition. The LSI is packaged into a system LSI together with a CPU core, a memory controller, an interface, and the like, which is mounted in various kinds of electronic equipment.

A CPU core is supplied with electric power via a source line from an external AC power source through an AC-DC converter and a DC-DC converter. For example, in a case where CPU has a processing speed of 300 MHz, CPU repeats turning on/off (ON/OFF) once every about 30 ns. However, at the time of switching of CPU from OFF to ON, the voltage of CPU cannot be recovered sufficiently only by an electric current from the source line in an instant. As a result, the processing speed of CPU lowers substantially. On that account, a capacitor is connected in parallel with the source line in order to make up for an instantaneous shortage of electric current to CPU and promote prompt recovery of the CPU voltage.

As for such capacitor, a large capacitance and transient responsibility, i.e. low ESL performance, are required primarily. Also, it is required to slim the capacitor with downsizing of electronic equipments in recent years. Therefore, a mounting board with such a capacitor mounted in this way is required to be slimmed, too. To meet the requirement, a method of embedding a capacitor as a surface-mounted part in a mounting board is proposed. Such method is disclosed by Japanese Patent Unexamined Publication No. 2003-197849, for example.

However, the method of embedding a capacitor in a mounting board needs a space to embed the capacitor in. Accordingly, slimming down of a mounting board is insufficient.

DISCLOSURE OF THE INVENTION

The present invention is amounting board having a capacitor built therein and is slimed in addition. The mounting board of the invention has a capacitor-forming sheet made from a valve metal, a first board-forming structure, a second board-forming structure, a first electrode, a second electrode, an extractor electrode, and a conductive polymer. The capacitor-forming sheet has an inner layer, and a rough oxide film provided on at least one face of the inner layer. The first board-forming structure is provided on a face of the capacitor-forming sheet, and the second board-forming structure is provided on another face thereof on a side opposite to the first board-forming structure. The first electrode and second electrode are electrically isolated to each other and provided on a surface of at least one of the first and second board-forming structures. The extractor electrode and the conductive polymer are provided inside at least one of the first board-forming structure and the second board-forming structure. The extractor electrode electrically connects the first electrode with the inner layer. The conductive polymer electrically connects the second electrode with the rough oxide film. This structure eliminates the need for a capacitor-mounting space and therefore a mounting board can be slimed down.

BRIEF DESCRIPTION OF THE DRAWINGS

FIG. 3 is a sectional view showing another arrangement to connect LSI with the mounting board shown in FIG. 2.

FIG. 4A is a sectional view showing a manufacturing step of another arrangement to contact LSI with the mounting board shown in FIG. 2.

FIG. 4B is a sectional view showing a condition where LSI is connected with the mounting board, which is subsequent to the arrangement shown in FIG. 4A.

FIG. 6A is a sectional view showing a manufacturing step of the mounting board shown in FIG. 2.

FIG. 6B is a sectional view showing a manufacturing step subsequent to FIG. 6A.

FIG. 6C is a sectional view showing a manufacturing step subsequent to FIG. 6B.

FIG. 6D is a sectional view showing a manufacturing step subsequent to FIG. 6C.

FIG. 11 is a sectional view of another mounting board according to the third exemplary embodiment of the present invention.

FIG. 12 is a sectional view of a mounting board according to a fourth exemplary embodiment of the present invention.

DETAILED DESCRIPTION OF PREFERRED EMBODIMENTS

A mounting board, a mounted body, and electronic equipment using the same of the present invention will be described below in reference to the drawings. The descriptions will be presented taking a mounting board mounted with an image-processing LSI as the mounted body, and a digital television as the electronic equipment.

First Exemplary Embodiment

Figure 1:
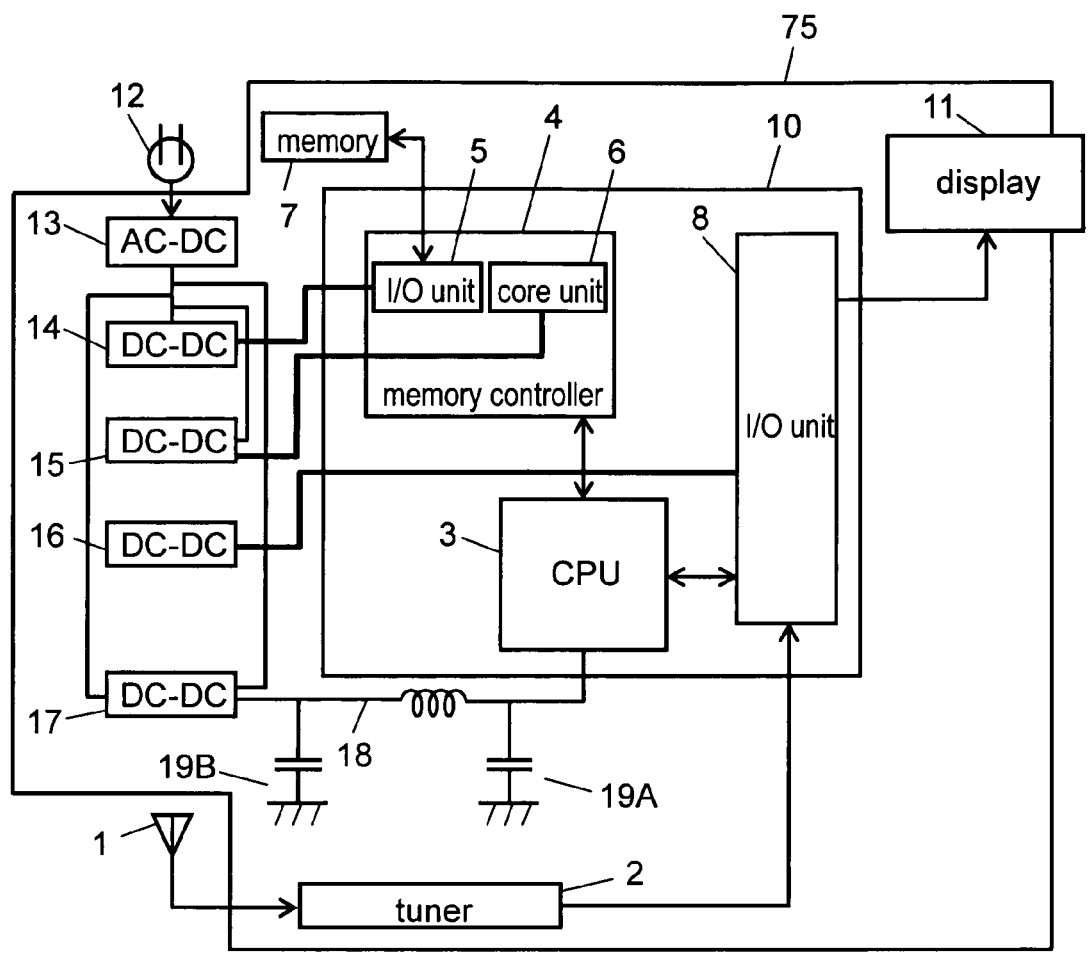
FIG. 1 is a block diagram of a multi-power source image-processing LSI in a first exemplary embodiment of the present invention.

FIG. 1 is a block diagram of a multi-power source image-processing LSI of a digital television, that is electronic equipment according to the first exemplary embodiment of the present invention. A signal input from antenna 1 undergoes tuning by tuner 2, and is input to CPU 3 through I/O unit 8 of LSI 10 for image processing. LSI 10 includes CPU 3, and memory controller 4 connected with CPU 3 by a signal line. I/O unit 5 of memory controller 4 is connected with memory 7 provided independently of LSI 10. CPU 3 and memory 7 perform a large capacity image processing operation. The processed image signal is output from CPU 3 to display 11 through I/O unit 8.

CPU 3, I/O unit 5 and core unit 6 of memory controller 4, and I/O unit 8 are driven by different voltages, respectively. For example, CPU 3 is driven by a voltage of 1.5V, I/O unit 5 is driven by 2V, core unit 6 is driven by 1V, and interface I/O unit 8 is driven by 3V. These electric powers are supplied by DC-DC converters 14, 15, 16 and 17, which convert a voltage from external AC power source 12 through AC-DC converter 13 into the respective voltages. These parts are disposed in housing 75.

Here, a circuit to supply CPU 3 with an electric power will be described in detail. Dc-DC converter 17 supplies electric power to CPU 3 through source line 18. Capacitor 19A is connected in parallel with source line 18. Capacitor 19A supplies an electric current in order to help prompt recovery of voltage of CPU 3 at the time of OFF/ON.

Source line 18 has an inductance component due to the length of line. Therefore, it is desirable to make the length of line as short as possible, thereby to reduce the inductance component (particularly ESL component in a high frequency region) and thus to improve driving performance of CPU 3. In a similar reason, it is desirable that capacitor 19A is connected near CPU 3 and capacitor 19A itself has a low ESL. In addition, in order to reduce a loss in supplying an electric current, it is desirable that capacitor 19A has a low ESR. With respect to source line 18, it is preferable to dispose capacitor 19B larger in capacity than capacitor 19A near DC-DC converter 17 in addition to capacitor 19A.

Figure 2:
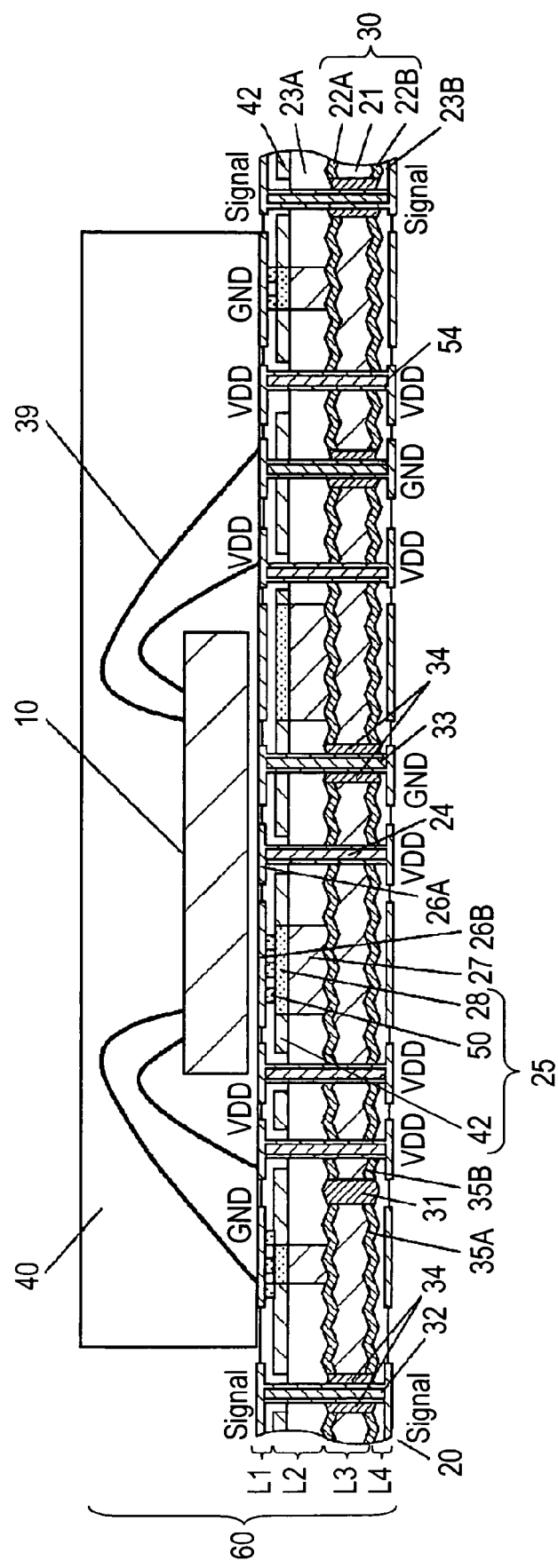
FIG. 2 is a sectional view of a mounting board according to the first exemplary embodiment of the present invention.

Now, a mounting board incorporating LSI 10 that is a semiconductor device, and a mounted body constituted by the mounting board and LSI will be described. FIG. 2 is a sectional view of the mounted body in the present embodiment. As an example, there is shown mounting board 20 of a structure of four layers of L1 to L4.

For example, aluminum oxide which is rough oxide film 22A is formed on a first face of valve metal 21 made of aluminum (Al). Likewise, aluminum oxide which is rough oxide film 22B is formed on a second face of valve metal 21 opposite to the first face. Valve metal 21 and rough oxide films 22A and 22B constitute capacitor-forming sheet 30. Specifically, valve metal 21 is an inner layer, and rough oxide films 22A and 22B are provided on the inner layer. In addition to Al, valve metal 21 may be any metals having a valve effect, such as tantalum (Ta), niobium, titanium, and an alloy containing any of the metals as a matrix.

First board-forming structure 23A made of a resin is formed on a surface of rough oxide film 22A, and second board-forming structure 23B made of a resin is formed on a surface of rough oxide film 22B. In other words, first board-forming structure 23A and second board-forming structure 23B are provided on the first and second face sides of capacitor-forming sheet 30, respectively.

Extractor electrode 24, which is provided so as to connect with valve metal 21, pierces first board-forming structure 23A and second board-forming structure 23B and appears in front and rear faces of mounting board 20, and is connected with first electrode 26A on the front side (the first face side) and first electrode 26C on the rear side (the second face side). Conductive polymer 27 connected with rough oxide film 22A appears in a surface of mounting board 20 through middle electrode 25, and is in electrical contact with second electrode 26B. Second electrode 26B and first electrodes 26A, 26C are electrically isolated. Extractor electrode 24, valve metal 21, rough oxide film 22 and conductive polymer 27 constitute capacitor 19A shown in FIG. 1. Specifically, extractor electrode 24 and first electrode 26A correspond to a positive electrode of capacitor 19A, and conductive polymer 27 and second electrode 26B correspond to a cathode thereof.

Extractor electrode 24 is in electrical contact with first electrode 26A in the shortest distance. Conductive polymer 27 and middle electrode 25 are in electrical contact with second electrode 26B in the shortest distance. First electrode 26A and second electrode 26B are connected with LSI 10 in molded resin 40 via bonding wire 39. A structure like this makes the wiring length to LSI 10 the shortest. As a result, connection between capacitor 19A and LSI 10 is made low in ESL. To make the capacitance of capacitor 19A larger, it is desirable to make a connection area between conductive polymer 27 and rough oxide film 22A as large as possible.

Each of extractor electrodes 24 is used as signal line 32, source (VDD) line 54, or ground (GND) line 33. In the drawings, together with reference numerals, they are labeled with "signal", "VDD" and "GND", respectively. Here, signal line 32 and GND line 33 are electrically insulated from valve metal 21 by insulating layer 34 provided at an interface along with valve metal 21.

It is preferable that first electrode 26A and second electrode 26B are made of copper (cu) or an alloy containing copper. Cu has the highest electrical conductivity of metals second to silver, and therefore it can lower the electrical loss. Extractor electrode 24 can be formed by through-hole plating or applying and drying a conductive paste. It is preferable to form extractor electrode 24 By through-hole plating because the reliability of connection with first electrode 26A is improved. Middle electrode 25 can be formed of silver pastes 28 and 50 and nickel foil 42. Otherwise, copper paste, silver-covered copper paste or a composite paste thereof may be used instead of silver pastes 28 and 50. Thus, middle electrode 25 contains at least one selected from among silver, cu, and nickel (Ni), whereby its electrical conduction is ensured.

For conductive polymer 27, polypyrrole, polyaniline and polythiophene may be used independently or in combination. As these materials have a good affinity for rough oxide film 22B, they can reduce the interface resistance of rough oxide film 22B and conductive polymer 27. As a result, ESR particularly in a high frequency region can be reduced.

In the case of providing middle electrode 25, it is preferable to provide a carbon layer (not shown) between conductive polymer 27 and silver paste 28. The carbon layer can lower the interface resistance of conductive polymer 27 and silver paste 28. As a result, ESR particularly in a high frequency region can be reduced.

In a case where LSI 10 has narrow pitch pads, LSI 10 may be connected with mounting board 20 through wiring layer 29 as shown in FIG. 3. In this case, mounting board 20 with wiring layer 29 provided on its surface layer can be handled in the same way as for dealing with a conventional interposer, which is a general-purpose merit for users. Also, a buildup layer can be provided on a surface layer of mounting board 20 to cope with a fine pitch. In other words, it is preferable that wiring layer 29 is finely formed on a surface layer of mounting board 20 by plating connection according to the buildup method. This is because mounting board 20 can be handled in the same way as for dealing with a conventional interposer.

Blind via 52 may be formed in a surface layer of mounting board 20 as shown in FIG. 4A, followed by electrolytic plating the inside of blind via 52 to form a buildup layer as shown in FIG. 4B, which may be used as wiring layer 29A. It is also possible to use wiring layer 29A to cope with the fine pitch. Blind via 52 is formed by direct or conformal laser bore processing. A filled via may be formed in blind via 52.

It is preferable that mounting board 20 takes on a structure such that it can cope with a multi-power source system LSI as shown in FIGS. 2 and 3, i.e. it is divided into capacitor-forming elemental structures in a direction of a plane of capacitor-forming sheet 30. Specifically, capacitor-forming elemental structures 35A and 35B are electrically independent of each other by insulating layer 31 made of resin. Each of capacitor-forming elemental structures 35A and 35B is provided with first electrode 26A, second electrode 26B, extractor electrode 24 and conductive polymer 27, respectively.

Figure 5:
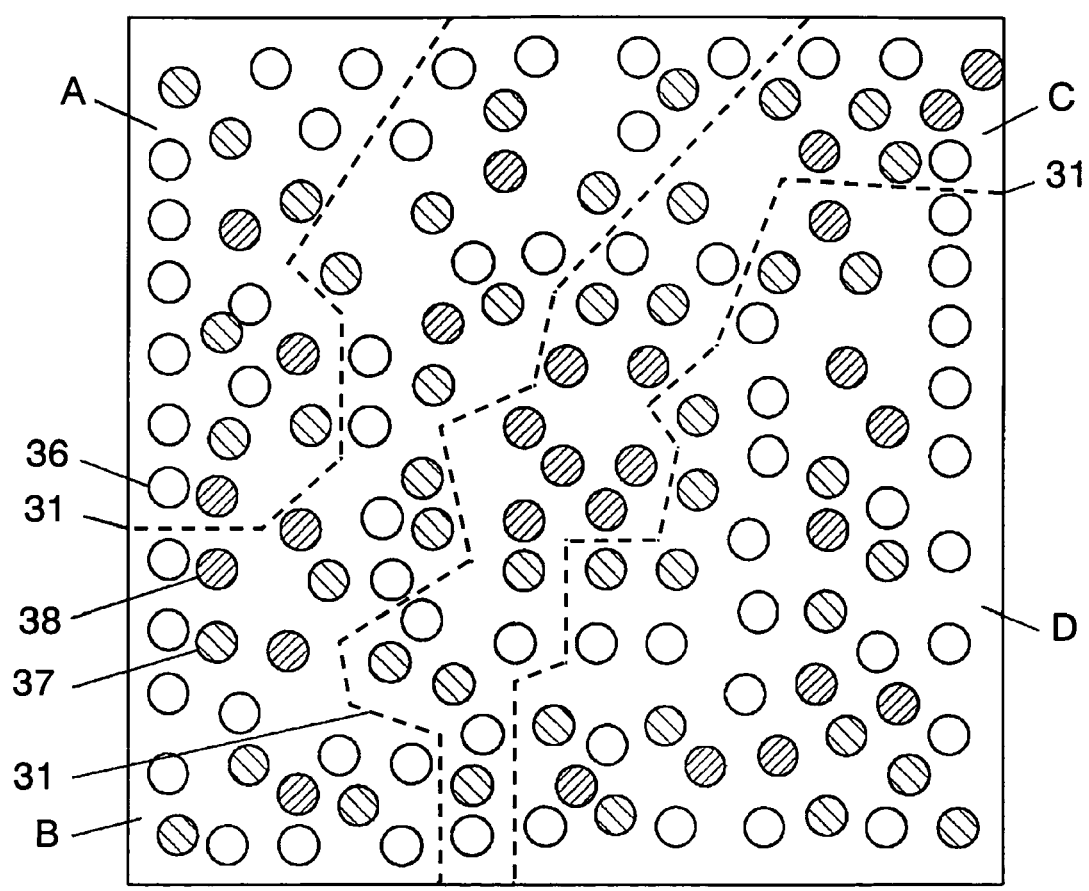
FIG. 5 is a top view of the mounting board shown in FIG. 2.

FIG. 5 is a top view of mounting board 20. Signal pad 36, VDD pad 37 and GND pad 38 are disposed at predetermined locations. The pads represent first electrode 26A, second electrode 26B, and the like in FIG. 2. Mounting board 20 is divided into four areas of A to D in top view. For example, the voltage in area A is 2.0V; the voltage in area B is 1.0V; the voltage in area C is 1.5V; and the voltage in area D is 3.0V.

These areas are divided by insulating layers 31, which cannot be seen from above the top face of mounting board 20. Source lines of different voltages to cope with a multi-power source system LSI are thus connected for each of capacitor-forming elemental structures 35A and 35B, whereby good power source quality supporting the multi-power source can be achieved. Also, this makes possible to realize a semiconductor package which can assure a stable operation of LSI having multiple system functions.

Now, an example of a manufacturing method of the mounting board of the invention will be described with reference to FIGS. 6A to 8C. FIGS. 6A to 8C are sectional views each showing a manufacturing step of mounting board 20.

First, as shown in FIG. 6A, valve metal 21 is treated by a chemical solution to form porous rough oxide films 22A and 22B in front and rear faces (the first face and the second face) of valve metal 21. Second, as shown in FIG. 6B, second board-forming structure 23B is formed on a surface of rough oxide film 22B using a resin, followed by providing open bore 41 at predetermined positions. Then, as shown in FIG. 6C, open bore 41 is filled with resin 43. Incidentally, if second board-forming structure 23B and resin 43 are formed by an identical resin, a portion of second board-forming structure 23B which has been removed seems to be returned in providing open bore 41 as shown in FIG. 6C for the sake of convenience.

Then, as shown in FIG. 6D, first board-forming structure 23A is formed on a surface of rough oxide film 22A with a resin, leaving predetermined positions thereon, i.e. sections where conductive polymer 27 is to be formed. After that, nickel foil 42 is provided on a surface of first board-forming structure 23A, and then masking is performed by masking film 44, leaving bores 45, i.e. sections where conductive polymer 27 is to be formed.

Figure 7A:
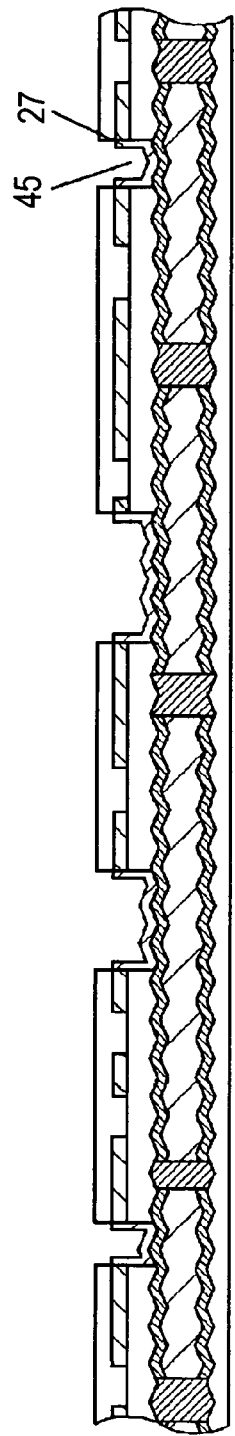
FIG. 7A is a sectional view showing a manufacturing step subsequent to FIG. 6D.
Figure 7B:
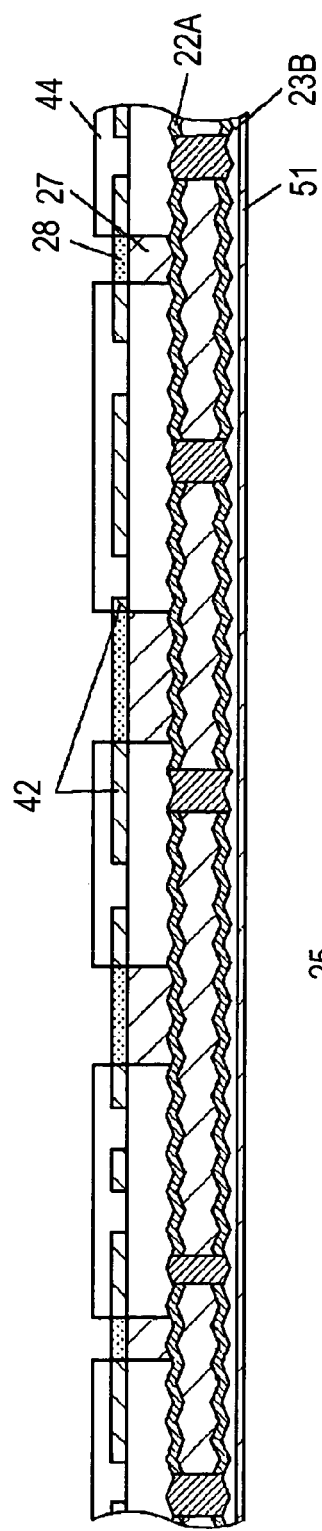
FIG. 7B is a sectional view showing a manufacturing step subsequent to FIG. 7A.
Figure 7C:
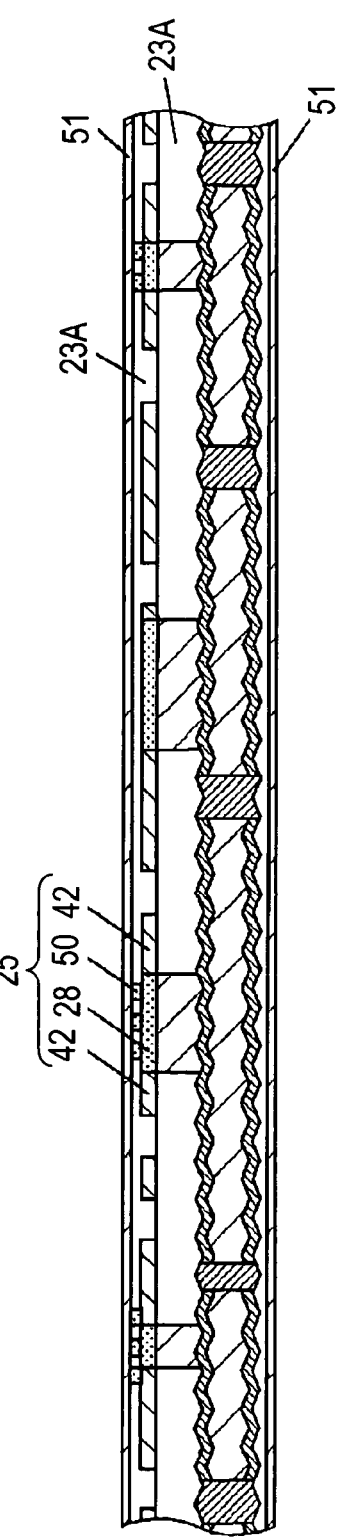
FIG. 7C is a sectional view showing a manufacturing step subsequent to FIG. 7B.

Subsequently, as shown in FIG. 7A, conductive polymer 27 is formed on an inner circumferential face and a bottom face of bore 45 by chemical polymerization. Then, as shown in FIG. 7B, a antecedent body of the mounting board produced in connection with FIG. 7A is immersed in a polymerizing solution, and electrolytic polymerization is carried out using nickel foil 42 as an anode, thereby making conductive polymer 27 grow. Thereafter, silver paste 28 is applied to an exposed surface of conductive polymer 27 to make a electrical connect between conductive polymer 27 and nickel foil 42 in its peripheral portion, thereby forming a portion of middle electrode 25. Also, copper foil 51 is provided on a surface of second board-forming structure 23B. Next, as shown in FIG. 7C, masking film 44 is removed. Resin is used to further expand first board-forming structure 23A to surfaces of nickel foil 42, first board-forming structure 23A and silver paste 28. In addition, a via is formed on a surface of silver paste 28 is formed, and silver paste 50 is poured into the via thereby to form middle electrode 25. Subsequently, copper foil 51 is disposed so as to be in electrical contact with middle electrode 25.

Figure 8A:
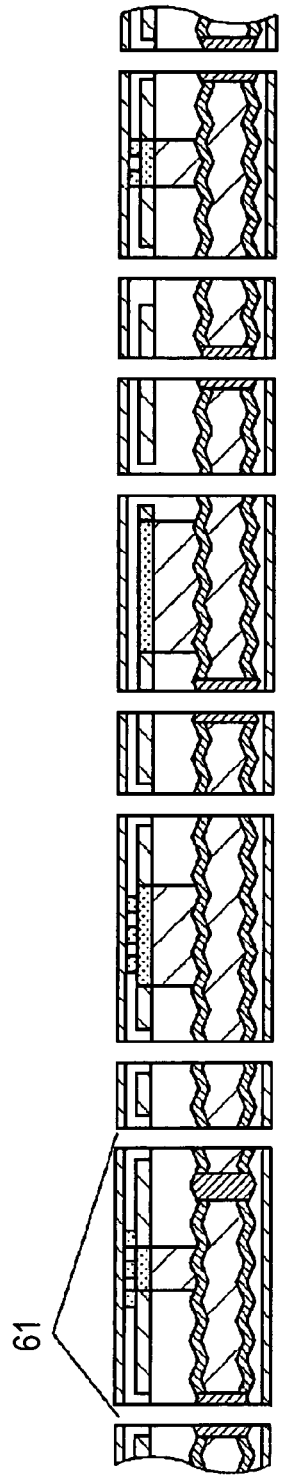
FIG. 8A is a sectional view showing a manufacturing step subsequent to FIG. 7C.
Figure 8B:
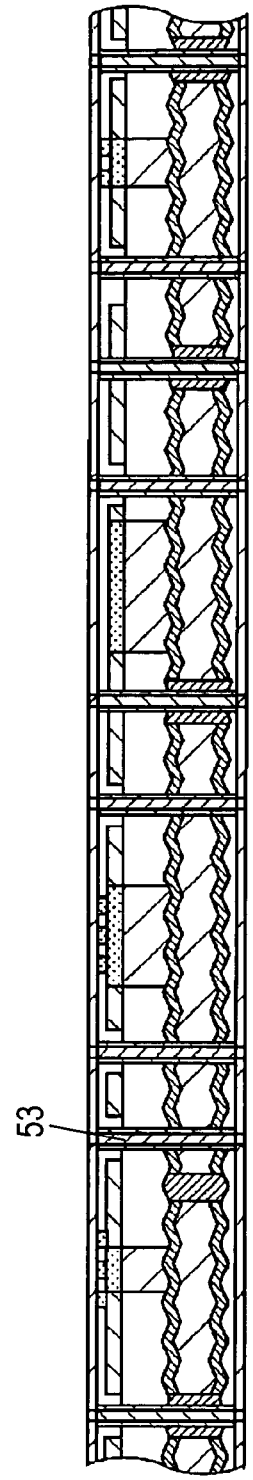
FIG. 8B is a sectional view showing a manufacturing step subsequent to FIG. 8A.
Figure 8C:
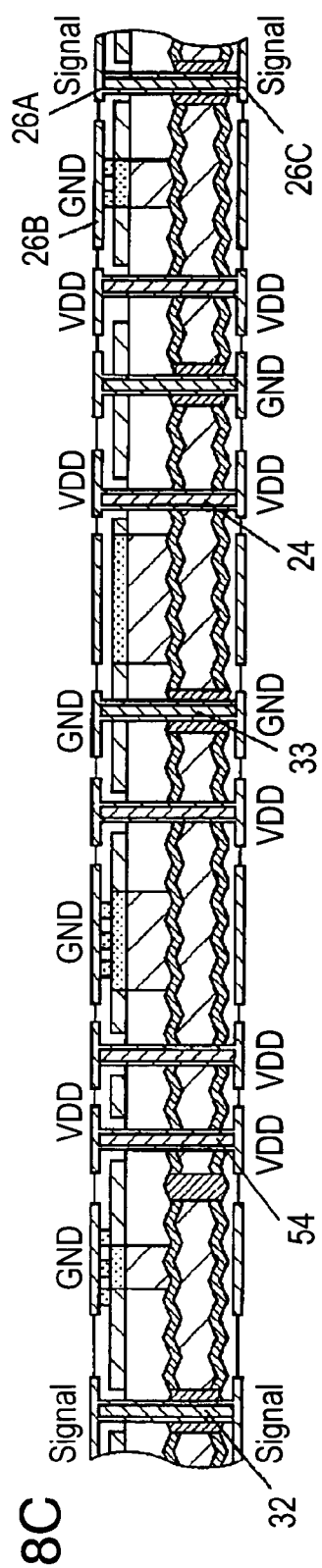
FIG. 8C is a sectional view showing a manufacturing step subsequent to FIG. 8B.

Next, as shown in FIG. 8A, through-hole 61 is formed at a predetermined location. Then, as shown in FIG. 8B, through-hole 61 is filled in by copper plating to form through electrode 53 for forming signal line 32, GND line 33, VDD line 54 and extractor electrode 24 shown in FIG. 2. Finally, as shown in FIG. 8C, copper foil 51 is patterned to form first electrode 26A and second electrode 26B.

According to the above manufacturing steps, mounting board 20 is produced. By using mounting board 20 thus slimmed (thin), mounted body 60, which is a semiconductor package, can be also slimmed. Further, use of mounted body 60 in electronic equipment enables slimming down of the electronic equipment.

Second Exemplary Embodiment

Figure 9:
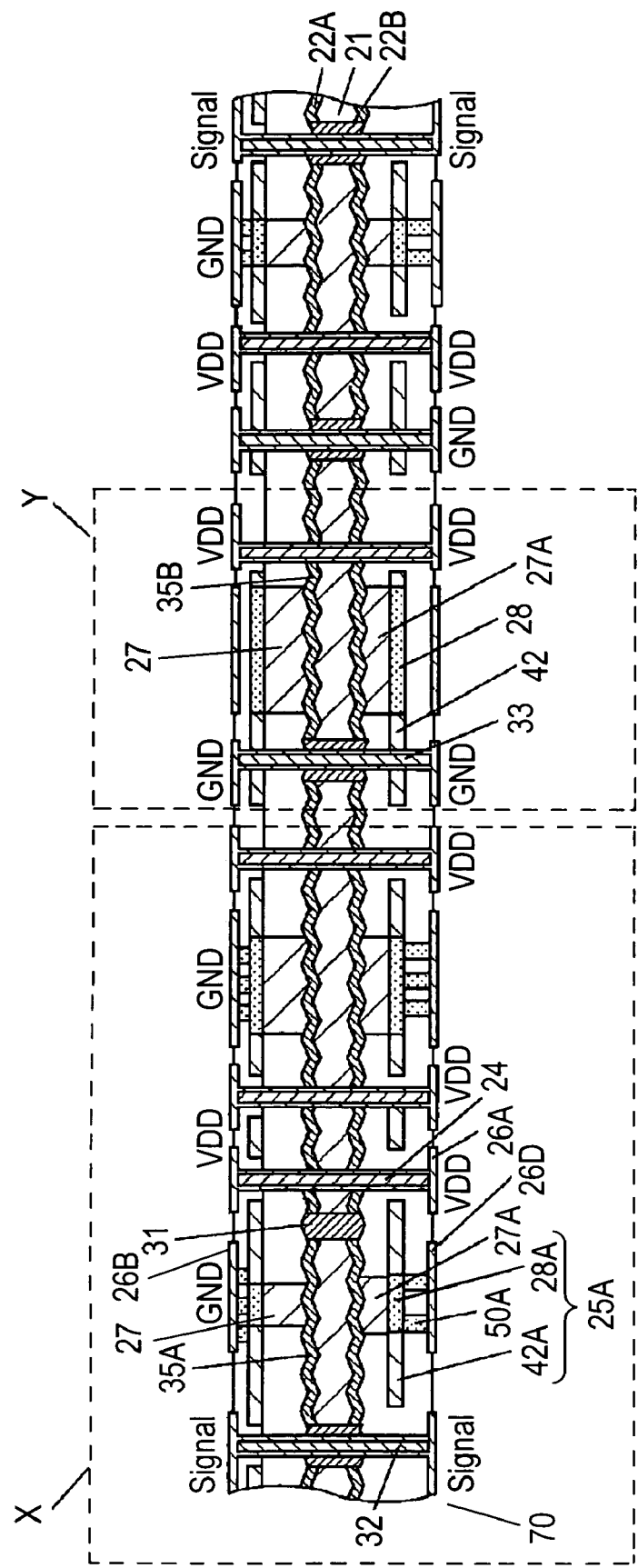
FIG. 9 is a sectional view of a mounting board according to a second exemplary embodiment of the present invention.

FIG. 9 is a sectional view of a mounting board in the second exemplary embodiment of the invention. Mounting board 70 in the present embodiment is different from mounting board 20 of the first exemplary embodiment in that second conductive polymer 27A (hereinafter referred to as "conductive polymer 27A") is also provided on rough oxide films 22B on the second face side of capacitor-forming elemental structures 35A and 35B dividing capacitor-forming sheet 30. Other basic configuration is the same as that in the first exemplary embodiment. Conductive polymer 27A is formed from the same material as that of conductive polymer 27.

In region X in FIG. 9, conductive polymer 27A and middle electrode 25A provided on rear faces of capacitor-forming elemental structures 35A and 35B are connected with second electrode 26D on a rear face of mounting board 70. This configuration can realize a three-terminal structure having a configuration where two capacitors are connected in series when viewed as an electric circuit.

As shown in region Y in FIG. 9, electrical contact between conductive polymer 27A and GND line 33 provides a configuration where two capacitors are connected in parallel when viewed as an electric circuit, and therefore a large capacitance is achieved.

As described above, when rough oxide films 22A and 22B are provided on front and rear faces of valve metal 21, design flexibility as a capacitor is improved. Further, valve metal 21 like this is an electrode foil made of Al after anodization, which has been used as an electrode foil of an anode of an aluminum electrolytic capacitor conventionally, and it has high general versatility.

Third Exemplary Embodiment

Figure 10:
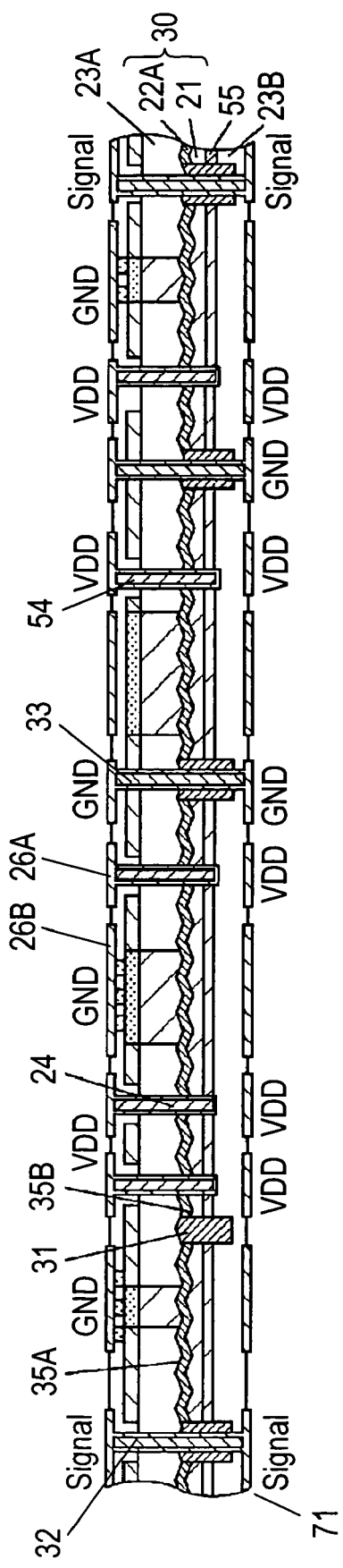
FIG. 10 is a sectional view of a mounting board according to a third exemplary embodiment of the present invention.

FIG. 10 is a sectional view of a mounting board according to the third exemplary embodiment of the invention. Mounting board 71 of the present embodiment differs from mounting board 20 of the first exemplary embodiment in the following points: rough oxide film 22A is provided on only one side of capacitor-forming sheet 30A; and metal layer 55 is provided between valve metal 21 and second board-forming structure 23B. Specifically, metal layer 55 in electrical contact with valve metal 21 which is an inner layer of capacitor-forming elemental structures 35A and 35B is provided on the rear face (the second face) of capacitor-forming elemental structures 35A and 35B. Also, metal layer 55 is in electrical contact with extractor electrode 24. Other basic configuration is the same as that in the first exemplary embodiment.

In the case where using capacitor-forming sheet 30A having rough oxide film 22A formed on only one side of valve metal 21, it is possible to make the thickness of mounting board 71 thinner in comparison to capacitor-forming sheet 30 having rough oxide films 22A and 22B formed on front and rear faces of valve metal 21.

In addition, extractor electrode 24 and metal layer 55 can be brought into electrical contact by providing metal layer 55 on the rear face of valve metal 21, reliably. In other words, even when the connection areas of extractor electrode 24 and capacitor-forming elemental structures 35A and 35B are small, interposition of metal layer 55 can bring capacitor-forming elemental structures 35A and 35B and extractor electrode 24 into electrical contact reliably. Thus, the reliability of mounting board 71 is improved.

Further, metal layer 55 and first electrode 26A, which sandwich therebetween capacitor-forming elemental structures 35A and 35B and which serve as respective electrode layers, can be made a power source layer (a portion of VDD line), and second electrode 26B can be made a ground electrode layer (a portion of GND line). Therefore, it is possible to configure a mounting board having a functional multilayer structure.

Metal layer 55 can be constructed of e.g. Cu, Ni, or an alloy containing one of them. These materials are preferable because of their small electrical resistances. In this case, metal layer 55 can be formed by plating. Also, extractor electrode 24 can be formed by use of a conductive paste, and it may be formed by through-hole plating.

While in the embodiments described above, a mounting board having a four-layer structure has been described as an example, the invention is not so limited. For example, as shown in FIG. 11, the mounting board may be of a structure with three layers L1 to L3. FIG. 11 is a sectional view of a mounting board having a three-layer structure. As a mounting board having a three-layer structure has a small number of layers like this, the thickness of the mounting board can be made thinner.

Except the number of layers, mounting board 72 differs from mounting board 20 of the first exemplary embodiment in that nickel foil 42 is not provided. In this case, it is impossible to promote growth of conductive polymer 27 by a method of electrolytic polymerization, in which nickel foil 42 is used as an anode as described in the first exemplary embodiment. However, conductive polymer 27 can be formed by use of the chemical polymerization, a method by applying a solution having conductive polymer 27 dispersed therein or the like.

Fourth Exemplary Embodiment

Figure 13:
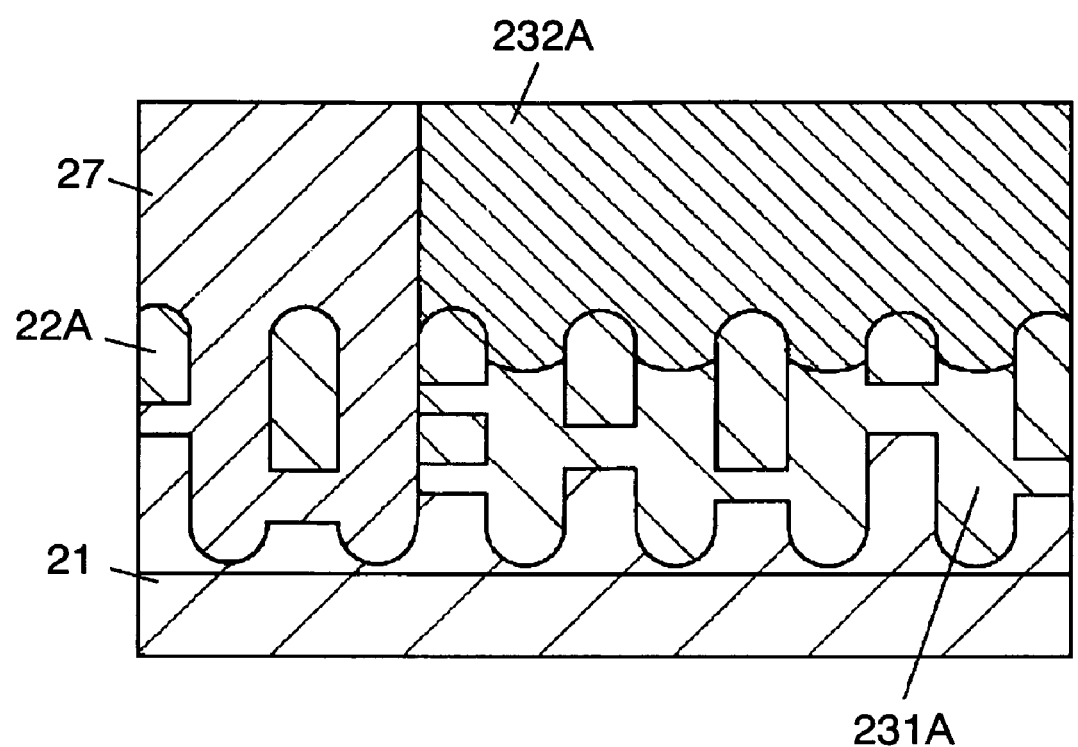
FIG. 13 is an enlarged sectional view of an essential portion of the mounting board shown in FIG. 12.

FIG. 12 is a sectional view of a mounting board in the fourth exemplary embodiment of the present invention, and FIG. 13 is an enlarged sectional view of an essential portion thereof. Mounting board 73 of the present embodiment differs from mounting board 20 of the first exemplary embodiment in that first insulating layer 231A and second insulating layer 232A constitute a portion corresponding to first board-forming structure 23A.

First insulating layer 231A is formed inside porous rough oxide film 22A, and second insulating layer 232A is formed on first insulating layer 231A. In other words, first insulating layer 231A is impregnated into rough oxide film 22A and thus formed. First insulating layer 231A is formed using a liquid resin.

Second insulating layer 232A is formed by curing a sheet-like resin made of an admixture of inorganic filler and a heat-hardening resin. The inorganic filler of second insulating layer 232A is silica, for example. The sheet-like resin has plasticity in a condition prior to curing, and is called composite sheet in general. Other basic configuration is the same as that in the first exemplary embodiment.

As described with reference to FIG. 6D, in the first exemplary embodiment, first board-forming structure 23A is formed with a resin, leaving a section on a front face of rough oxide film 22A where conductive polymer 27 is to be formed. Meanwhile, rough oxide film 22A is in a sponge-like condition and has a disposition to absorb a matter in a liquid condition easily. Hence, to determine the place of conductive polymer 27, it is required to apply an electrically insulating resin or the like to surroundings of the place of conductive polymer 27 thereby to saturate the inside of rough oxide film 22A completely. When such treatment is not performed sufficiently, the value of capacitance will vary or the insulating property will deteriorate. However, when the insulating resin is applied, the resin flows into a portion where conductive polymer 27 is to be formed, and thus the capacitance of the capacitor is reduced.

Further, when the amount of the resin is increased or its viscosity is reduced in order to allow the insulating resin to flow into rough oxide film 22A easily, the above-phenomena is made more significant and the capacitance of the capacitor is further reduced. In contrast, when the amount of the resin is decreased or the viscosity is increased, it becomes impossible to saturate the inside of rough oxide film 22A with the resin completely. In addition, an excessively small amount of the resin causes conductive polymer 27 to extend off the periphery, and thus it becomes difficult to form a compact element.

In the arrangement of the present embodiment, the resin with which the inside of rough oxide film 22A is saturated, and the resin overlying it are made up of different materials. This arrangement allows rough oxide film 22A to be completely saturated with the resin and prevents conductive polymer from extending off excessively. In addition, a perfect insulation structure can be obtained by covering the upper side with second insulating layer 232A.

Now, it is preferable that second board-forming structure 23B is produced by curing a sheet-like resin made of an admixture of inorganic filler and a heat-hardening resin like second insulating layer 232A. Further, it is preferable that they have substantially the same thickness. Thus, the warping of mounting board 73 is suppressed, and the flatness is improved.

Figure 14A:
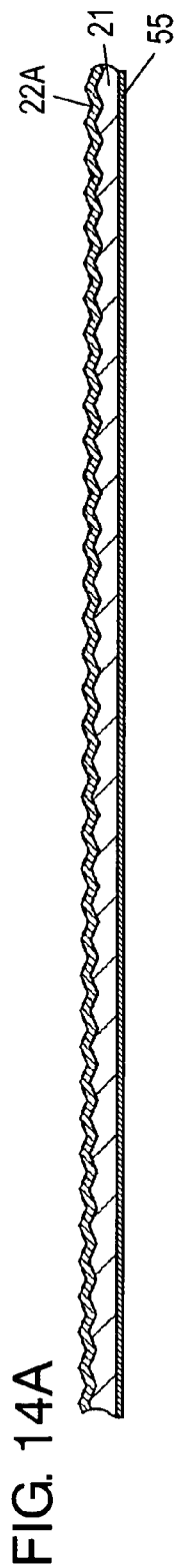
FIG. 14A is a sectional view showing a manufacturing step of the mounting board shown in FIG. 12.

Next, an example of the manufacturing method will be described with reference to FIGS. 14A to 15C. First, as shown in FIG. 14A, valve metal 21 is processed by a chemical solution thereby to form porous rough oxide film 22A on a front face (the first face) of valve metal 21, whereas metal layer 55 is provided on a rear face (second face) of valve metal 21 by plating or the like.

Figure 14B:
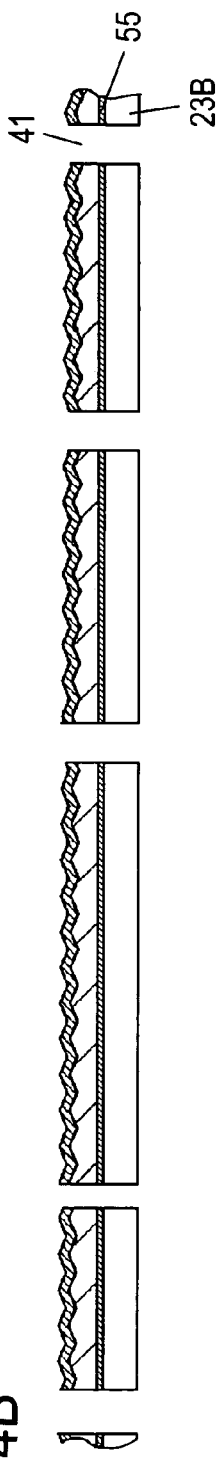
FIG. 14B is a sectional view showing a manufacturing step subsequent to FIG. 14A.
Figure 14C:
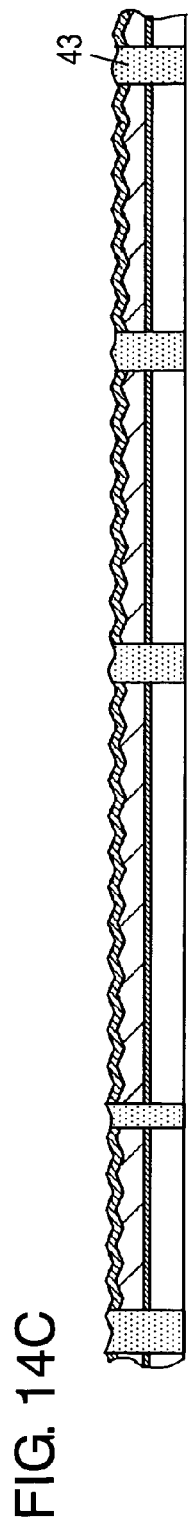
FIG. 14C is a sectional view showing a manufacturing step subsequent to FIG. 14B.

Then, as shown in FIG. 14B, second board-forming structure 23B is formed using a resin and then open bore 41 is provided at predetermined positions. Then, as shown in FIG. 14C, open bore 41 is filled with resin 43.

Figure 14D:
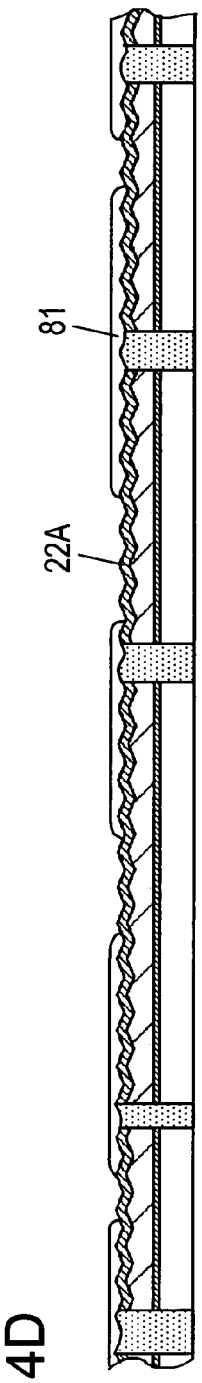
FIG. 14D is a sectional view showing a manufacturing step subsequent to FIG. 14C.

Next, as shown in FIG. 14D, liquid resin 81 is applied to a front face of rough oxide film 22, leaving predetermined positions thereon, i.e. sections where conductive polymer 27 is to be formed. Liquid resin 81 has a viscosity in a range such that it infiltrates into rough oxide film 22A. Liquid resin 81 is applied while being adjusted in viscosity so as not to spread to a section where conductive polymer 27 is formed.

Figure 15A:
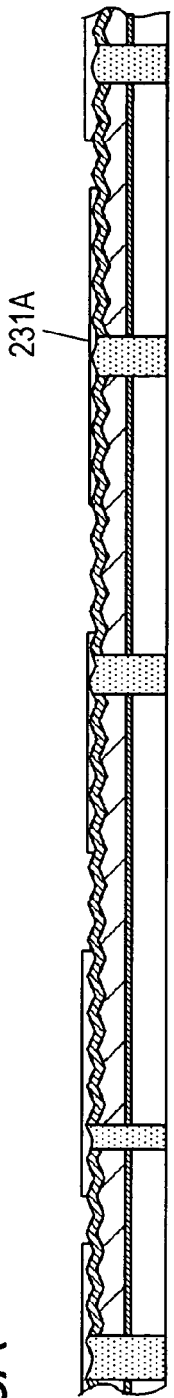
FIG. 15A is a sectional view showing a manufacturing step subsequent to FIG. 14D.

In regard to the material of liquid resin 81, a material containing epoxy resin or polyimide resin as its main agent is used, for example. Or, a photosensitive resin is used as liquid resin 81, and the viscosity is increased by irradiating the resin with light in parallel with the impregnation of the resin into rough oxide film 22A. Thus, the resin is prevented from spreading to an extra position. Otherwise, a low-viscosity resin prepared by dispersing a resin component in a solvent having a disposition to volatilize at a temperature equal to or below a permanent curing temperature may be used as liquid resin 81, and the viscosity can be increased by putting the resin under the circumstance at the volatilization temperature of the solvent after infiltration into rough oxide film 22A. Also, a low-viscosity resin prepared by dispersing a resin component in a solvent, which does not volatilize at a room temperature, may be used as liquid resin 81, and the viscosity can be increased by leaving the resin in vacuum after application thereby to lower the vapor pressure and thus accelerating the volatilization of the solvent. After that, liquid resin 81 is made to permanently cure by e.g. leaving it at a high temperature, and thus first insulating layer 231A is formed as shown in FIG. 15A. While first insulating layer 231A is shown as if it has some thickness in the drawings, most of first insulating layer 231A sinks into rough oxide film 22A.

Figure 15B:
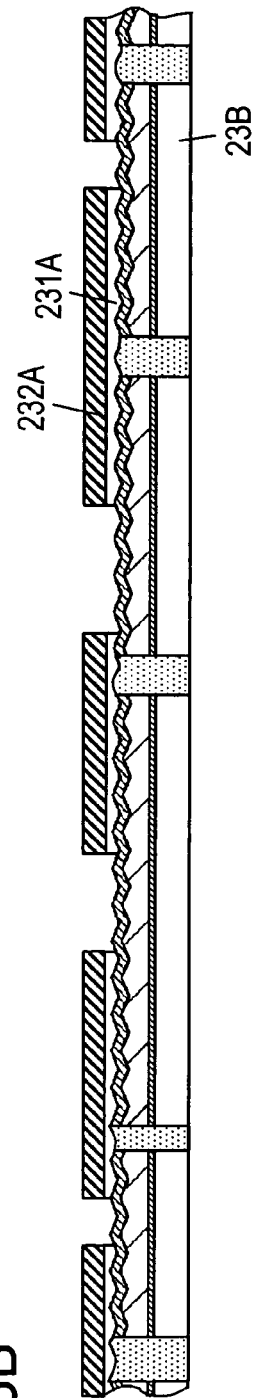
FIG. 15B is a sectional view showing a manufacturing step subsequent to FIG. 15A.

As in FIG. 15B, second insulating layer 232A is formed on first insulating layer 231A. Second insulating layer 232A is formed by: superposing a semi-hardening resin sheet (sheet-like resin) made of an admixture of inorganic filler and a heat-hardening resin on first insulating layer 231A; applying a pressure to them; and then leaving them at a curing temperature. The sheet-like resin has some plasticity even at an ordinary temperature in a condition before curing, and it has a larger fluidity when a stress is applied to it at a high temperature and cures by heat after fluidizing, whereby its shape is held. However, the sheet-like resin has a higher viscosity in comparison to liquid resin 81 even when it is heated, and therefore the sheet-like resin does not flow into rough oxide film 22A further than liquid resin 81 does even when fluidization occurs. It is preferable that second board-forming structure 23B is made up of the same material as that of second insulating layer 232A as described above.

Use of resin 81 in a liquid form allows first insulating layer 231A to be formed in rough oxide film 22A hardly extending off it. Also, by using a sheet-like resin like this, which is produced by adequately mixing inorganic filler and a heat-hardening resin, the height of the whole first board-forming structure can be ensured by second insulating layer 232A sufficiently. This improves the reliability of insulation.

Also, it is preferable that in the condition where first insulating layer 231A is placed at a temperature equal to or below the full curing temperature and made to provisionally cure, a sheet-like resin is superposed on first insulating layer 231A and then they are made to fully cure while a pressure is applied to them. Thus, their adhesion is improved.

Alternatively, it is preferable that the sheet-like resin is superpose on first insulating layer 231A after curing of first insulating layer 231A, and then they are placed in vacuum and preheated at or under the permanent curing temperature while a pressure is applied to them. Thus, air between the sheet-like resin and the first insulating layer can be removed thereby to achieve more perfect adhesion, and adhesion between the sheet-like resin and the first insulating layer can be made tougher by making the sheet-like resin to permanently cure thereafter.

Figure 15C:
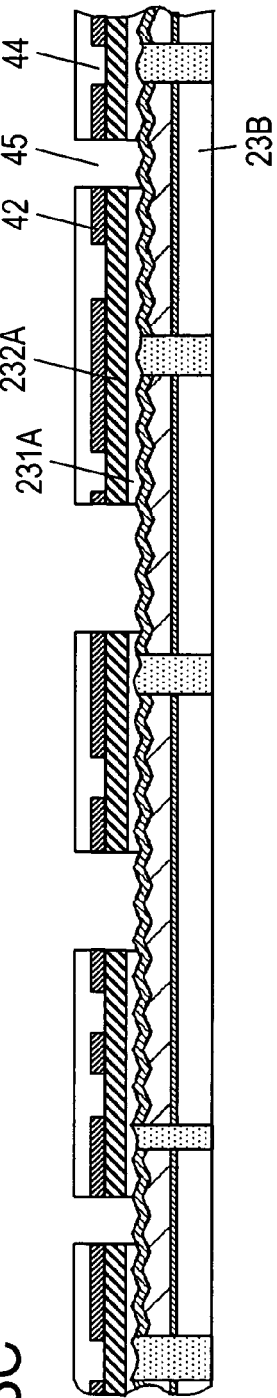
FIG. 15C is a sectional view showing a manufacturing step subsequent to FIG. 15B.

After that, as shown in FIG. 15C, nickel foil 42 is provided on a surface of second insulating layer 232A, and then masking is performed by masking film 44, leaving bores 45, i.e. sections where conductive polymer 27 is formed. Thereafter, as in FIGS. 7A and 7B in the first exemplary embodiment, conductive polymer 27 is formed on an inner circumferential face and a bottom face of bore 45 by chemical polymerization, and then the mounting board antecedent body is immersed in a polymerizing solution, and electrolytic polymerization is carried out using nickel foil 42 as an anode, thereby making conductive polymer 27 grow. Thereafter, in the same way as that after FIG. 7C in the first exemplary embodiment, mounting board 73 is produced.

If the inside of the rough oxide film 22A is saturated with no insulating material, the polymerizing solution spreads to a section other than a element portion, which can cause a defect of short circuit. If the height of the first board-forming structure constituted by first insulating layer 231A and second insulating layer 232A is low, conductive polymer 27 can cross over the first board-forming structure, causing a defect of short circuit. According to an arrangement such that first insulating layer 231A and second insulating layer 232A are formed as in the present embodiment, the occurrence of such problem can be prevented, and insulation can be ensured.

In the above-described manufacturing method, bore 41 is provided before second board-forming structure 23B is stuck to valve metal 21. However, after first insulating layer 231A is provided, bore 41 may be provided and then closed by a resin in a sheet-like form, of which second insulating layer 232A is constructed.

Figure 16:
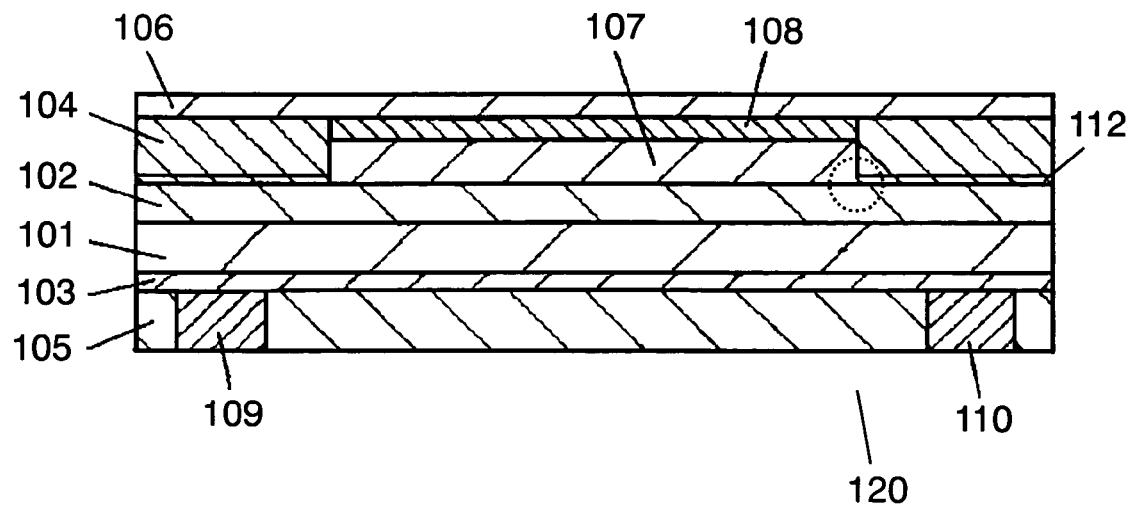
FIG. 16 is a sectional view of a solid electrolytic capacitor according to the fourth exemplary embodiment of the present invention.
Figure 17:
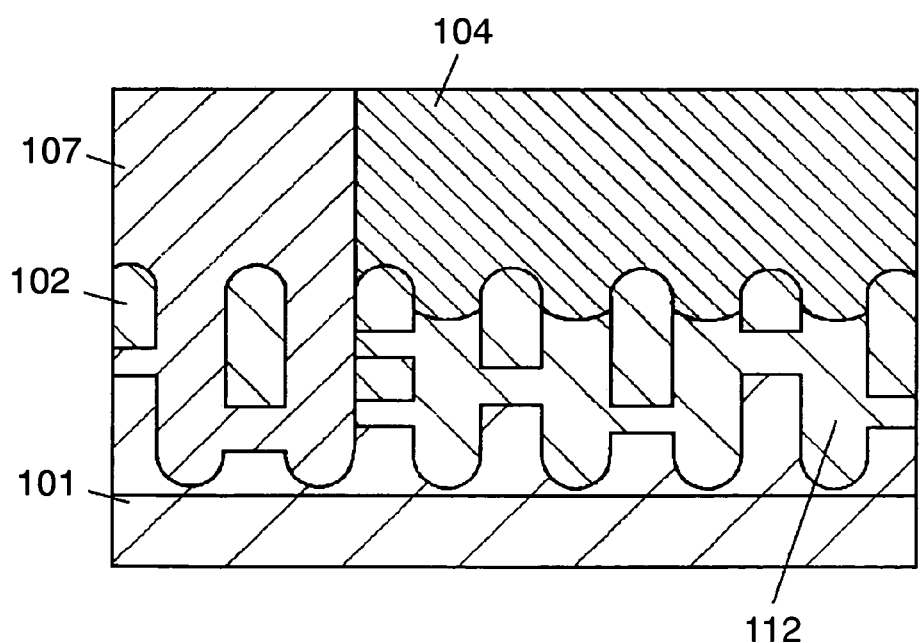
FIG. 17 is an enlarged sectional view of an essential portion of the solid electrolytic capacitor shown in FIG. 16.

With mounting board 73 described above, conductive polymer 27 works as a solid electrolyte. Therefore, mounting board 73 is a board having a solid electrolytic capacitor built therein, the arrangement of forming first insulating layer 231A and second insulating layer 232A can be also applied to a solid electrolytic capacitor. The description on such a solid electrolytic capacitor will be presented hereinafter. FIG. 16 is a sectional view of a solid electrolytic capacitor in the present embodiment, and FIG. 17 is an enlarged view of a portion surrounded by a broken line in FIG. 16.

Valve metal sheet 101 is of a material such as Al or Ta, which corresponds to valve metal 21 in FIG. 12. The front face (the first face) side of valve metal sheet 101 is made porous through a treatment by a chemical solution, whereby porous portion 102 corresponding to rough oxide film 22A is formed. In addition, positive electrode 103, which is composed of a plated layer of cu, Ni or the like and corresponds to metal layer 55, is provided on the rear face (the second face) side of valve metal sheet 101. On porous portion 102, first insulating layer 112 corresponding to first insulating layer 231A and second insulating layer 104 corresponding to second insulating layer 232A are formed. On positive electrode 103, third insulating layer 105 corresponding to second board-forming structure 23B is formed. Second insulating layer 104 and third insulating layer 105 are produced by curing a sheet-like resin made of an admixture of inorganic filler and a heat-hardening resin. It is preferable that the two layers have substantially the same thickness.

On second insulating layer 104, negative electrode 106 composed of a conductor of cu, Ni or the like and corresponding to second electrode 26B is stacked. Inside them, solid electrolyte layer 107 corresponding to conductive polymer 27 and collector layer 108 corresponding to silver paste 28 are provided as shown in FIG. 16. Second insulating layer 104 has a form with its central portion hollowed out, in which a portion of porous portion 102 is exposed. Further, solid electrolyte layer 107 constructed of a conductive polymer is formed so as to cover the exposed portion of porous portion 102, on which collector layer 108 constructed of carbon and silver paste is formed. On a surface of porous portion 102, a dielectric layer made of an oxide of a metal which constitutes valve metal sheet 101 is formed. Positive electrode 103 in electrical contact with valve metal sheet 101 and negative electrode 106 in electrical contact with solid electrolyte layer 107 and collector layer 108 are insulated electrically, and thus a capacitor element is formed.

A portion of third insulating layer 105 is removed, and a conducting material is charged into the removed portion, whereby extractor electrodes 109 and 110 in electrical contact with positive electrode 103 are formed. Extractor electrodes 109, 110 correspond to first electrode 26A.

As shown in FIG. 17, solid electrolyte layer 107 is charged into porous portion 102, which contributes to an increase in capacity. Also, an insulating resin is charged into porous portion 102 under second insulating layer 104, whereby first insulating layer 112 is provided.

Thus, solid electrolytic capacitor 120 is configured. In solid electrolytic capacitor 120, like mounting board 73, first insulating layer 112 is provided inside the porous portion 102, on which second insulating layer 104 is provided. This improves the reliability of insulation as in mounting board 73.

Also, when second insulating layer 104 and third insulating layer 105 are identical in their material, warping of solid electrolytic capacitor 120 is prevented and the flatness is improved. Thus, the mountability to the board is improved. Further, it is preferable that second insulating layer 104 and third insulating layer 105 have the same thickness.

Figure 18:
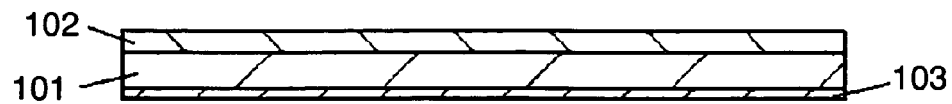
FIG. 18 is a sectional view showing a manufacturing step of the solid electrolytic capacitor shown in FIG. 16.
Figure 19:
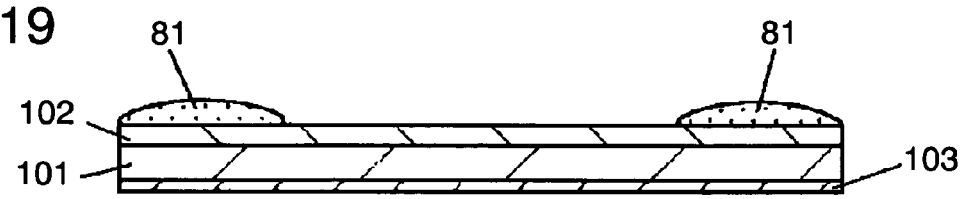
FIG. 19 is a sectional view showing a manufacturing step subsequent to FIG. 18.

Next, an example of the manufacturing method will be described with reference to FIGS. 18 to 28. First, as shown in FIG. 18, porous portion 102 is provided on the front face side of valve metal sheet 101, and positive electrode 103 is formed on the rear face side by plating or the like. Then, as shown in FIG. 19, liquid resin 81 is applied to a section to be insulated. The material of liquid resin 81 is as described above.

Figure 20:
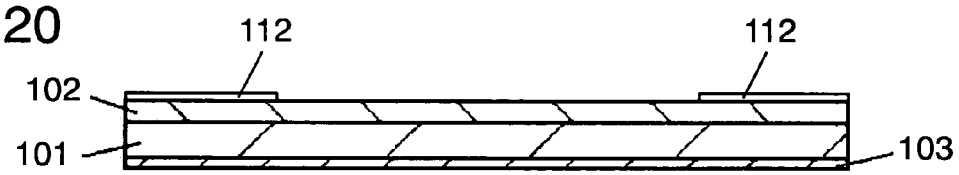
FIG. 20 is a sectional view showing a manufacturing step subsequent to FIG. 19.
Figure 21:
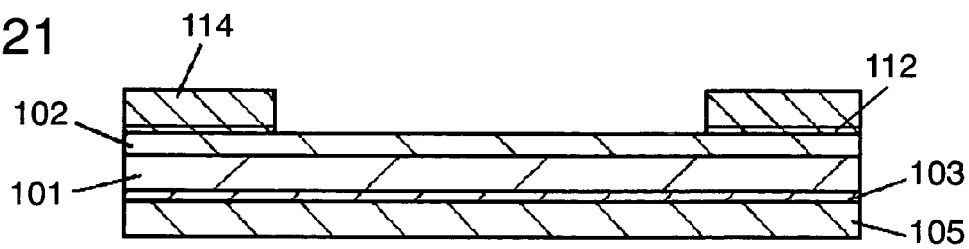
FIG. 21 is a sectional view showing a manufacturing step subsequent to FIG. 20.

After that, as shown in FIG. 20, liquid resin 81 is left at a high temperature, for example, to permanently cure, thereby forming first insulating layer 112. Next, as shown in FIG. 21, second insulating layer 104 is formed on first insulating layer 112, and third insulating layer 105 is formed on positive electrode 103. The method of forming second insulating layer 104 and third insulating layer 105 is the same as that of second insulating layer 232A in mounting board 73. Third insulating layer 105 is also produced by curing a sheet-like resin, whereby third insulating layer 105 and valve metal sheet 101 are bonded firmly.

Figure 22:
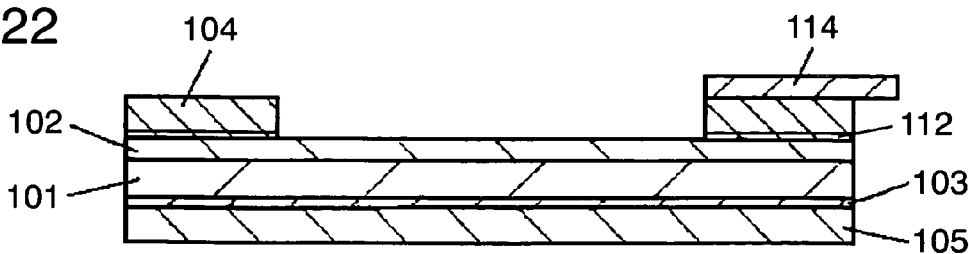
FIG. 22 is a sectional view showing a manufacturing step subsequent to FIG. 21.
Figure 23:
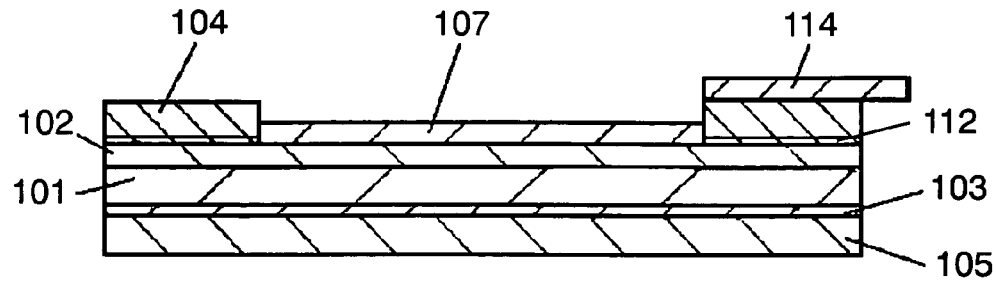
FIG. 23 is a sectional view showing a manufacturing step subsequent to FIG. 22.

After forming second insulating layer 104, power supply portion 114 made of Ni, stainless steel or the like is stuck onto second insulating layer 104 as shown in FIG. 22. Then, as shown in FIG. 23, solid electrolyte layer 107 is formed at a predetermined position in porous portion 102 and on it by polymerization. Solid electrolyte layer 107 is formed by: thinly applying powder of a conductive polymer, e.g. thiophene, or forming a thin layer of a conductive polymer by chemical polymerization; and then carrying out electrolysis in the polymerizing solution using power supply portion 114.

Figure 24:
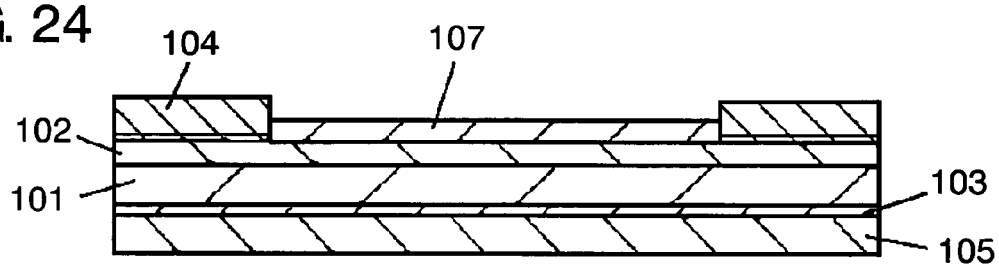
FIG. 24 is a sectional view showing a manufacturing step subsequent to FIG. 23.
Figure 25:
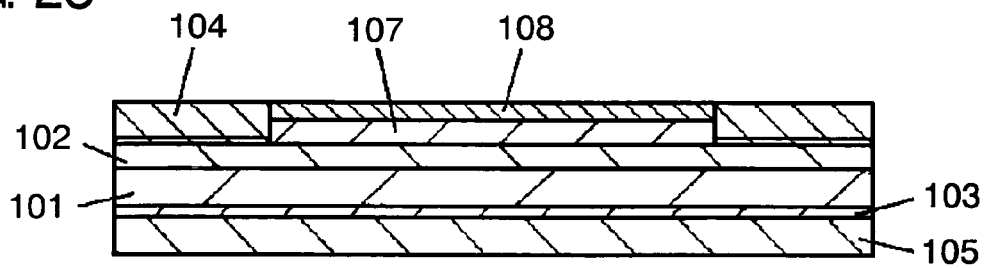
FIG. 25 is a sectional view showing a manufacturing step subsequent to FIG. 24.
Figure 26:
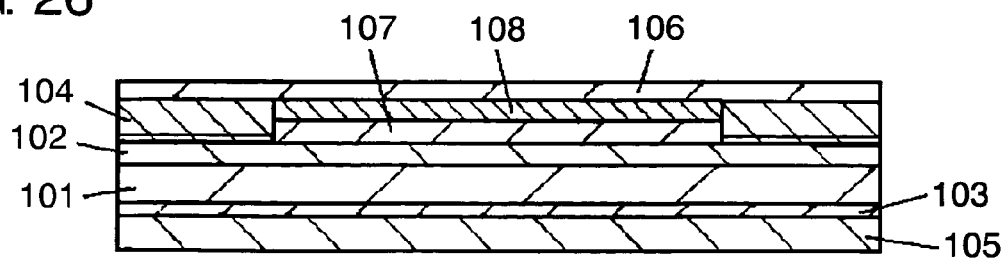
FIG. 26 is a sectional view showing a manufacturing step subsequent to FIG. 25.

Subsequently, as in FIG. 24, power supply portion 114 is taken off, and carbon and silver pastes and the like are applied onto solid electrolyte layer 107 to form collector layer 108 as shown in FIG. 25. Then, e.g. copper foil is stuck onto collector layer 108 and second insulating layer 104 as shown in FIG. 26 using e.g. an adhesive and a silver paste thereby to form negative electrode 106.

Figure 27:
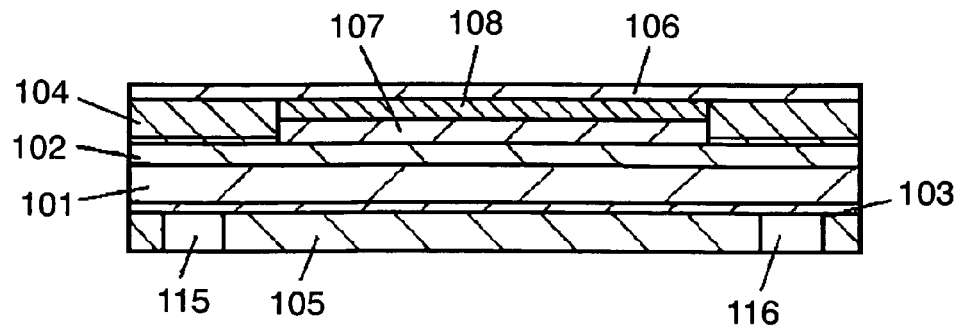
FIG. 27 is a sectional view showing a manufacturing step subsequent to FIG. 26.
Figure 28:
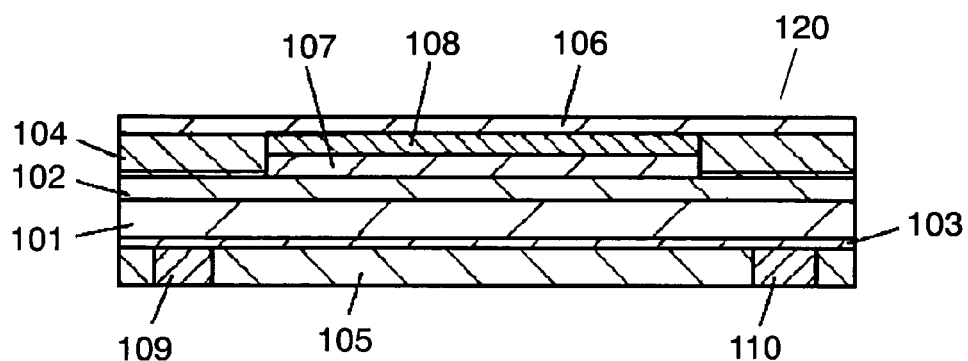
FIG. 28 is a sectional view showing a manufacturing step subsequent to FIG. 27.

Successively, as shown in FIG. 27, third insulating layer 105 is machined by laser processing or the like to expose positive electrode 103, thereby forming blind vias 115 and 116. Then, as in FIG. 28, a conducting member is charged into blind vias 115 and 116 to form extractor electrodes 109 and 110 in electrical contact with positive electrode 103.

Thus, solid electrolytic capacitor 120 is completed. By the above manufacturing method, a solid electrolytic capacitor according to the present embodiment can be produced readily.

Figure 29:
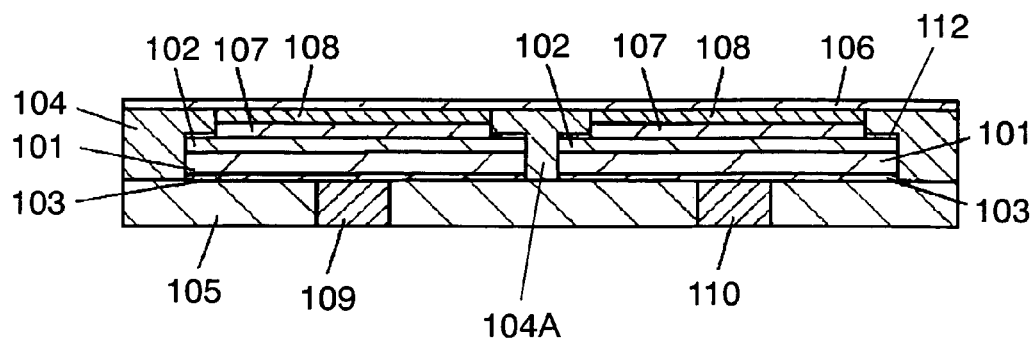
FIG. 29 is a sectional view of another solid electrolytic capacitor according to the fourth exemplary embodiment of the present invention.

As shown in the sectional view of FIG. 29, an arrangement such that plurality of solid electrolytic capacitors are provided together may be made by dividing valve metal sheet 101 and positive electrode 103 into two or more pieces by resin 104A. In this case, resin 104A corresponds to insulating layer 31 in mounting board 73. As these solid electrolytic capacitors are connected by a single structure, negative electrode 106, respective collector layers 108 are electrically connected and thus shared. On the other hand, valve metal sheet 101 and positive electrode 103 are divided discretely. Therefore, when the capacitors are mounted on circuits actually, negative electrodes 106 make a common ground and positive electrodes 103 are connected to different electric circuits respectively, whereby it becomes possible to make the capacitors operate individually.

As this arrangement allows solid electrolytic capacitors to be disposed close to one another in the same plane, the mounting efficiency is further increased. Additionally, third insulating layer 105 has enough strength to fix valve metal sheet 101 add the like after curing the sheet-like resin in this arrangement. Therefore, solid electrolytic capacitors can be formed with a large area at a time. Thus, a solid electrolytic capacitor array can be configured by disposing solid electrolytic capacitors close to one another. The solid electrolytic capacitor array allows planar solid electrolytic capacitors having high reliability of insulation to be disposed efficiently, and therefore it can contribute to the reduction in volume of mounting. Also, because solid electrolytic capacitors can be formed at a time, it is simple to make an array and the productivity is satisfying. Such solid electrolytic capacitors and solid electrolytic capacitor array can be applied to compact equipment such as a personal computer and a mobile phone.

While as for each embodiment described above, the arrangement in which middle electrode 25 is provided has been described, middle electrode 25 is not essential and it can be provided as required. However, since the flexibility of design according to the electrical connection between conductive polymer 27 and second electrode 26B is improved when middle electrode 25 is interposed between conductive polymer 27 and second electrode 26B, it is preferable to do so.

As described above, each of mounting boards 20, 70, 71, 72, 73 has: capacitor-forming sheet 30; first board-forming structure 23A, or first insulating layer 231A and second insulating layer 232A; second board-forming structure 23B; first electrode 26A, 26C; second electrode 26B, 26D; extractor electrode 24; and conductive polymer 27, 27A. Capacitor-forming sheet 30 has valve metal 21 as an inner layer, and rough oxide film 22A, 22B provided on at least one face of the inner layer. First board-forming structure 23A is provided on a surface of capacitor-forming sheet 30 and second board-forming structure 23B is provided on the face opposite to first board-forming structure 23A. First electrode 26A, 26C and second electrode 26B, 26D are electrically isolated to each other and provided on a surface of at least one of first board-forming structure 23A and second board-forming structure 23B. Extractor electrode 24 and conductive polymer 27, 27A are provided inside at least one of first board-forming structure 23A and second board-forming structure 23B. Extractor electrode 24 electrically connects first electrodes 26A, 26B and valve metal 21. Conductive polymer 27, 27A electrically connects second electrode 26B, 26D and rough oxide film 22A, 22B.

Such a structure allows capacitor 19A in FIG. 1 to be built in a board in the form of a sheet-like slim structure, and therefore slimming down of mounting boards 20, 70, 71, 72 and 73 can be realized.

While in the exemplary embodiments, the electronic equipment has been described taking a digital television as an example, mounting boards 20, 70, 71, 72, 73 can be applied to electronic equipment including a car navigation system, a home server and a DVD.

Also, while an image-processing LSI has been used as a semiconductor device, the invention is not so limited, it can be applied to anything as long as it is a semiconductor device.

INDUSTRIAL APPLICABILITY

A semiconductor-mounting board of the present invention has an effect and advantage such that it can be thin, and is useful for electronic equipment using a semiconductor, such as a digital television, a car navigation system, a home server and a DVD.

The invention claimed is:

1. A mounting board comprising:
   a capacitor-forming sheet made from a valve metal, and having a first face and a second face opposite to the first face, and having an inner layer and a rough oxide film provided on at least one face on a side of the first face and a side of the second face of the inner layer;
   a first board-forming structure provided on the first face side of the capacitor-forming sheet;
   a second board-forming structure provided on the second face side of the capacitor-forming sheet;
   a first electrode provided on a surface of at least one of the first and second board-forming structures;
   a second electrode provided on a surface of at least one of the first and second board-forming structures, and electrically isolated from the first electrode;
   an extractor electrode provided inside at least one of the first and second board-forming structures, and electrically connecting the first electrode and the inner layer; and
   a conductive polymer provided inside at least one of the first and second board-forming structures, and electrically connecting the second electrode and the rough oxide film.

2. The mounting board according to claim 1, wherein the capacitor-forming sheet is divided into capacitor-forming elemental structures in a direction parallel with the first face by an insulating layer made of resin, the capacitor-forming elemental structures being electrically independent of each other and
   the first electrode, the second electrode, the extractor electrode and the conductive polymer are provided for each capacitor-forming elemental structure, respectively.

3. The mounting board according to claim 1, wherein the extractor electrode is in electrical contact with the first electrode in a shortest distance, and
   the conductive polymer is in electrical contact with the second electrode in a shortest distance.

4. The mounting board according to claim 1, wherein the extractor electrode is formed by through-hole plating.

5. The mounting board according to claim 1, wherein the first and second electrodes contain copper.

6. The mounting board according to claim 1, further comprising a metal layer provided on the second face of the capacitor-forming sheet and in electrical contact with the inner layer and the extractor electrode.

7. The mounting board according to claim 1, wherein the rough oxide film is provided on both faces of the capacitor-forming sheet on the first and second face sides.

8. The mounting board according to claim 1, wherein the conductive polymer contains at least one of polypyrrole, polyaniline and polythiophene.

9. The mounting board according to claim 1, further comprising a middle electrode interposed between the conductive polymer and the second electrode.

10. The mounting board according to claim 1, wherein the first board-forming structure has:
- a first insulating layer formed by impregnation into the rough oxide film; and
- a second insulating layer formed on the first insulating layer, the second insulating layer being made from an admixture of inorganic filler and a heat-hardening resin.

11. A mounted body, comprising:
the mounting board according to claim 1; and
a semiconductor device electrically connected with the first and second electrodes of the mounting board.

12. An electronic equipment comprising:
a mounted body having:
- the mounting board according to claim 1, and
- a semiconductor device electrically connected with the first and second electrodes of the mounting board;

a housing provided with the mounted body therein.

13. The mounting board according to claim 6, wherein the metal layer contains at least one of copper and nickel.

14. The mounting board according to claim 9, wherein the middle electrode contains at least one of silver, copper, and nickel.

15. The mounting board according to claim 9, wherein the middle electrode interposed between the conductive polymer and the second electrode composed of silver paste alone.

16. The mounting board according to claim 10, wherein the second board-forming structure and second insulating layer are made of the same material.

17. The mounted body according to claim 11, further comprising a wiring layer interposed between the first and second electrodes of the mounting board and the semiconductor device.

18. The mounting board according to claim 16, wherein the second board-forming structure and second insulating layer are constructed so as to have substantially the same thickness.

19. The mounted body according to claim 17, wherein the wiring layer is finely formed on a surface of the mounting board by plating connection according to a buildup method.

* * * * *